US012658877B2

(12) United States Patent
Goto et al.

(10) Patent No.: US 12,658,877 B2
(45) Date of Patent: Jun. 16, 2026

(54) ACOUSTIC WAVE DEVICE WITH REDUCED ACOUSTIC COUPLING

(71) Applicant: Skyworks Solutions, Inc., Irvine, CA (US)

(72) Inventors: Rei Goto, Osaka (JP); Hironori Fukuhara, Ibaraki (JP)

(73) Assignee: Skyworks Solutions, Inc., Irvine, CA (US)

( * ) Notice: Subject to any disclaimer, the term of this patent is extended or adjusted under 35 U.S.C. 154(b) by 999 days.

(21) Appl. No.: 17/808,487

(22) Filed: Jun. 23, 2022

(65) Prior Publication Data

US 2023/0006125 A1 Jan. 5, 2023

Related U.S. Application Data

(60) Provisional application No. 63/217,101, filed on Jun. 30, 2021, provisional application No. 63/217,121, filed on Jun. 30, 2021.

(51) Int. Cl.
*H03H 9/02* (2006.01)
*H03H 3/08* (2006.01)
(Continued)

(52) U.S. Cl.
CPC .......... *H03H 9/02574* (2013.01); *H03H 3/08* (2013.01); *H03H 9/02653* (2013.01);
(Continued)

(58) Field of Classification Search
CPC .......... H03H 9/14547; H03H 9/02574; H03H 9/02905; H03H 9/02614; H03H 3/08;
(Continued)

(56) References Cited

U.S. PATENT DOCUMENTS 3,786,373 A * 1/1974 Schulz .................... G01S 13/28
333/155
3,983,515 A * 9/1976 Mitchell ............ H03H 9/02622
29/25.35
(Continued)

FOREIGN PATENT DOCUMENTS

CN 114497114 A * 5/2022 ......... H03H 9/02661
CN 115242214 A 10/2022
(Continued)

OTHER PUBLICATIONS

Lee et al., "A cost-effective MEMS cavity packaging technology for mass production", IEEE Trans. Adv. Packaging, vol. 32(2):453-480 (2009).
(Continued)

*Primary Examiner* — J. San Martin
(74) *Attorney, Agent, or Firm* — VIA LLP

(57) ABSTRACT

An acoustic wave device is disclosed. The acoustic wave device can include a support substrate that includes a first substrate portion, a second substrate portion, and a third substrate portion between the first substrate portion and the second substrate portion. The acoustic wave device can also include a piezoelectric layer that includes a first portion over the first substrate portion and a second portion over the second substrate portion. The piezoelectric layer can be arranged such that a region over the third substrate portion is free from the piezoelectric layer. The acoustic wave device can also include a first interdigital transducer electrode on the first portion of the piezoelectric layer. The acoustic wave device can further include a second interdigital transducer electrode on the second portion of the piezoelectric layer.

20 Claims, 27 Drawing Sheets

(51) Int. Cl.
  *H03H 9/145* (2006.01)
  *H03H 9/64* (2006.01)
  *H10N 30/87* (2023.01)
  *H10N 30/88* (2023.01)
(52) U.S. Cl.
  CPC .... *H03H 9/02874* (2013.01); *H03H 9/14547*
    (2013.01); *H03H 9/6483* (2013.01); *H10N*
    *30/87* (2023.02); *H10N 30/88* (2023.02);
    *H03H 9/64* (2013.01)
(58) Field of Classification Search
  CPC ........... H03H 9/02653; H03H 9/02874; H03H
    9/6483; H03H 9/64; H10N 30/88; H10N
    30/87
  See application file for complete search history.

(56) References Cited

U.S. PATENT DOCUMENTS

| | | | | |
|---|---|---|---|---|
| 4,097,825 | A | * | 6/1978 | Gerard ...................... H03H 9/42 |
| | | | | 333/194 |
| 4,204,178 | A | * | 5/1980 | Mitchell ............ H03H 9/02779 |
| | | | | 333/194 |
| 4,634,914 | A | * | 1/1987 | Ballato ................ H03H 9/6423 |
| | | | | 333/195 |
| 4,773,138 | A | * | 9/1988 | Ballato .................... H03H 9/44 |
| | | | | 29/25.35 |
| 4,996,165 | A | | 2/1991 | Chang et al. |
| 5,113,115 | A | | 5/1992 | Mariani |
| 5,163,435 | A | * | 11/1992 | Soldner .................... H03H 3/08 |
| | | | | 310/333 |
| 5,245,734 | A | | 9/1993 | Issartel |
| 5,508,667 | A | | 4/1996 | Kondratiev et al. |
| 5,646,584 | A | | 7/1997 | Kondratyev et al. |
| 5,895,996 | A | | 4/1999 | Takagi et al. |
| 5,952,899 | A | | 9/1999 | Kadota et al. |
| 6,046,524 | A | | 4/2000 | Yamanouchi et al. |
| 6,262,513 | B1 | | 7/2001 | Furukawa et al. |
| 6,426,583 | B1 | * | 7/2002 | Onishi ................. H03H 9/1085 |
| | | | | 29/25.35 |
| 6,608,363 | B1 | | 8/2003 | Fazelpour |
| 6,637,087 | B1 | * | 10/2003 | Horiuchi .................. H03H 9/25 |
| | | | | 29/609.1 |
| 7,202,590 | B2 | * | 4/2007 | Matsuda ............ H03H 9/02905 |
| | | | | 333/195 |
| 7,230,512 | B1 | | 6/2007 | Carpenter et al. |
| 7,733,196 | B2 | | 6/2010 | Tsurunari et al. |
| 8,174,339 | B2 | | 5/2012 | Matsuda et al. |
| 8,228,137 | B2 | | 7/2012 | Inoue et al. |
| 8,378,760 | B2 | | 2/2013 | Iwaki et al. |
| 8,482,184 | B2 | | 7/2013 | Goto et al. |
| 8,836,111 | B2 | | 9/2014 | Conti et al. |
| 9,002,038 | B2 | | 4/2015 | Ochs et al. |
| 9,118,303 | B2 | | 8/2015 | Inoue |
| 9,219,467 | B2 | | 12/2015 | Inoue et al. |
| 9,246,533 | B2 | | 1/2016 | Fujiwara et al. |
| 9,337,354 | B2 | | 5/2016 | Protheroe et al. |
| 9,438,201 | B2 | | 9/2016 | Hori et al. |
| 9,484,886 | B2 | | 11/2016 | Takemura |
| 9,520,857 | B2 | | 12/2016 | Fujiwara et al. |
| 9,570,668 | B2 | | 2/2017 | Iwamoto |
| 9,722,573 | B2 | | 8/2017 | Fujiwara et al. |
| 9,822,001 | B2 | | 11/2017 | Gritti et al. |
| 9,831,850 | B2 | | 11/2017 | Kuroyanagi |
| 10,153,909 | B2 | | 12/2018 | Horváth et al. |
| 10,243,536 | B2 | | 3/2019 | Saijo et al. |
| 10,483,942 | B2 | | 11/2019 | Goto et al. |
| 10,637,432 | B2 | | 4/2020 | Kai |
| 11,050,406 | B2 | | 6/2021 | Maki et al. |
| 11,133,789 | B2 | | 9/2021 | Maki et al. |
| 11,222,855 | B2 | | 1/2022 | Yota et al. |
| 11,309,864 | B2 | | 4/2022 | Ibaragi et al. |
| 11,368,137 | B2 | | 6/2022 | Goto et al. |
| 11,387,193 | B2 | | 7/2022 | Yota et al. |
| 11,431,319 | B2 | | 8/2022 | Goto |
| 11,463,065 | B2 | | 10/2022 | Goto |
| 11,489,513 | B2 | | 11/2022 | Goto |
| 11,552,614 | B2 | | 1/2023 | Caron et al. |
| 11,616,487 | B2 | | 3/2023 | Nakamura et al. |
| 11,616,491 | B2 | | 3/2023 | Tang et al. |
| 11,621,690 | B2 | | 4/2023 | Fukuhara et al. |
| 11,658,688 | B2 | | 5/2023 | Abbott et al. |
| 11,664,780 | B2 | | 5/2023 | Goto et al. |
| 11,671,072 | B2 | | 6/2023 | Goto et al. |
| 11,677,377 | B2 | | 6/2023 | Goto et al. |
| 11,689,178 | B2 | | 6/2023 | Nakamura et al. |
| 11,722,122 | B2 | | 8/2023 | Goto et al. |
| 11,750,172 | B2 | | 9/2023 | Goto et al. |
| 11,830,826 | B2 | | 11/2023 | Yota et al. |
| 11,843,366 | B2 | | 12/2023 | Fukuhara et al. |
| 11,881,837 | B2 | | 1/2024 | Caron et al. |
| 11,923,822 | B2 | | 3/2024 | Maki et al. |
| 12,009,795 | B2 | | 6/2024 | Abbott et al. |
| 12,047,053 | B2 | | 7/2024 | Maki et al. |
| 12,063,027 | B2 | | 8/2024 | Goto et al. |
| 12,166,463 | B2 | | 12/2024 | Goto et al. |
| 12,368,430 | B2 | | 7/2025 | Goto et al. |
| 12,431,857 | B2 | | 9/2025 | Goto et al. |
| 2002/0158707 | A1 | * | 10/2002 | Noguchi .............. H03H 9/0576 |
| | | | | 333/133 |
| 2002/0163402 | A1 | | 11/2002 | Tsuzuki et al. |
| 2003/0011577 | A1 | | 1/2003 | Katsuki et al. |
| 2004/0007079 | A1 | | 1/2004 | Wilda |
| 2004/0196119 | A1 | | 10/2004 | Shibahara et al. |
| 2004/0222717 | A1 | * | 11/2004 | Matsuda ............ H03H 9/02866 |
| | | | | 310/313 R |
| 2004/0232802 | A1 | | 11/2004 | Koshido |
| 2006/0197630 | A1 | | 9/2006 | Fuse |
| 2007/0044296 | A1 | | 3/2007 | Jeon et al. |
| 2007/0080612 | A1 | | 4/2007 | Terazono et al. |
| 2008/0174389 | A1 | | 7/2008 | Mori et al. |
| 2008/0197941 | A1 | | 8/2008 | Suzuki et al. |
| 2011/0084382 | A1 | | 4/2011 | Chen et al. |
| 2011/0156837 | A1 | | 6/2011 | Inoue et al. |
| 2011/0254639 | A1 | | 10/2011 | Tsutsumi et al. |
| 2013/0113576 | A1 | | 5/2013 | Inoue et al. |
| 2013/0285768 | A1 | | 10/2013 | Watanabe et al. |
| 2014/0009032 | A1 | * | 1/2014 | Takahashi .......... H03H 9/02559 |
| | | | | 29/25.35 |
| 2014/0113571 | A1 | | 4/2014 | Fujiwara et al. |
| 2014/0339957 | A1 | | 11/2014 | Tajima et al. |
| 2016/0028373 | A1 | | 1/2016 | Costa et al. |
| 2016/0172573 | A1 | | 6/2016 | Iwaki et al. |
| 2016/0226464 | A1 | | 8/2016 | Fujiwara et al. |
| 2016/0268997 | A1 | | 9/2016 | Komatsu et al. |
| 2016/0277003 | A1 | | 9/2016 | Kikuchi et al. |
| 2017/0063332 | A1 | | 3/2017 | Gilbert et al. |
| 2017/0099043 | A1 | | 4/2017 | Goto et al. |
| 2017/0214386 | A1 | | 7/2017 | Kido |
| 2017/0222618 | A1 | | 8/2017 | Inoue et al. |
| 2017/0250669 | A1 | | 8/2017 | Kuroyanagi et al. |
| 2017/0272051 | A1 | | 9/2017 | Kurihara et al. |
| 2017/0273183 | A1 | | 9/2017 | Kawasaki et al. |
| 2017/0288627 | A1 | | 10/2017 | Takano et al. |
| 2017/0288629 | A1 | | 10/2017 | Bhattacharjee et al. |
| 2017/0331456 | A1 | | 11/2017 | Ono |
| 2017/0359048 | A1 | | 12/2017 | Yasuda |
| 2017/0373241 | A1 | | 12/2017 | Kimura |
| 2018/0013404 | A1 | | 1/2018 | Kawasaki et al. |
| 2018/0069529 | A1 | | 3/2018 | Bi et al. |
| 2018/0152169 | A1 | | 5/2018 | Goto et al. |
| 2018/0152191 | A1 | | 5/2018 | Niwa et al. |
| 2018/0262179 | A1 | | 9/2018 | Goto et al. |
| 2018/0316329 | A1 | | 11/2018 | Guenard et al. |
| 2018/0358406 | A1 | | 12/2018 | Block et al. |
| 2018/0367119 | A1 | | 12/2018 | Lee |
| 2019/0074819 | A1 | | 3/2019 | Goto et al. |
| 2019/0089334 | A1 | | 3/2019 | Koyanagi |
| 2019/0238114 | A1 | * | 8/2019 | Kishimoto ............. H03H 9/145 |
| 2019/0288661 | A1 | | 9/2019 | Akiyama et al. |
| 2019/0379347 | A1 | | 12/2019 | Goto et al. |
| 2020/0076402 | A1 | | 3/2020 | Koo et al. |
| 2020/0212884 | A1 | | 7/2020 | Shin et al. |

(56) References Cited

U.S. PATENT DOCUMENTS

| | | | |
|---|---|---|---|
| 2020/0228093 A1 | 7/2020 | Daimon | |
| 2020/0313646 A1* | 10/2020 | Caron | H03H 3/08 |
| 2020/0321937 A1 | 10/2020 | Kishi et al. | |
| 2020/0366270 A1 | 11/2020 | Matsuoka | |
| 2021/0020587 A1 | 1/2021 | Yota et al. | |
| 2021/0036209 A1 | 2/2021 | Osawa et al. | |
| 2021/0050842 A1 | 2/2021 | Tang et al. | |
| 2021/0111688 A1 | 4/2021 | Abbott et al. | |
| 2021/0111697 A1 | 4/2021 | Daimon et al. | |
| 2021/0118821 A1 | 4/2021 | Yota et al. | |
| 2021/0119650 A1 | 4/2021 | Abbott et al. | |
| 2021/0159876 A1 | 5/2021 | Maki et al. | |
| 2021/0218381 A1 | 7/2021 | Luo et al. | |
| 2021/0265970 A1* | 8/2021 | Yamaji | H03H 9/02842 |
| 2022/0014175 A1 | 1/2022 | Nagatomo et al. | |
| 2022/0077840 A1 | 3/2022 | Caron | |
| 2022/0103146 A1 | 3/2022 | Wang | |
| 2022/0140814 A1 | 5/2022 | Dyer et al. | |
| 2022/0158610 A1 | 5/2022 | Goto et al. | |
| 2022/0158611 A1 | 5/2022 | Potratz et al. | |
| 2022/0158612 A1 | 5/2022 | Goto et al. | |
| 2022/0209738 A1 | 6/2022 | Torazawa et al. | |
| 2022/0216845 A1 | 7/2022 | Yamane et al. | |
| 2022/0271734 A1 | 8/2022 | Abbott et al. | |
| 2022/0321096 A1 | 10/2022 | Goto et al. | |
| 2022/0329227 A1 | 10/2022 | Goto et al. | |
| 2022/0399867 A1 | 12/2022 | Goto et al. | |
| 2022/0399871 A1 | 12/2022 | Goto et al. | |
| 2023/0006636 A1 | 1/2023 | Goto et al. | |
| 2023/0006637 A1 | 1/2023 | Goto et al. | |
| 2023/0013597 A1 | 1/2023 | Goto et al. | |
| 2023/0016884 A1 | 1/2023 | Goto et al. | |
| 2023/0028925 A1 | 1/2023 | Kobayashi | |
| 2023/0031568 A1 | 2/2023 | Tang et al. | |
| 2023/0036775 A1 | 2/2023 | Goto et al. | |
| 2023/0054636 A1 | 2/2023 | Dutta et al. | |
| 2023/0055758 A1 | 2/2023 | Goto et al. | |
| 2023/0062981 A1 | 3/2023 | Fukuhara et al. | |
| 2023/0069327 A1 | 3/2023 | Fukuhara et al. | |
| 2023/0070350 A1 | 3/2023 | Rei | |
| 2023/0101228 A1 | 3/2023 | Brunner et al. | |
| 2023/0104405 A1 | 4/2023 | Hiramatsu et al. | |
| 2023/0107376 A1 | 4/2023 | Goto et al. | |
| 2023/0107820 A1 | 4/2023 | Fukuhara et al. | |
| 2023/0108686 A1 | 4/2023 | Fukuhara et al. | |
| 2023/0109106 A1 | 4/2023 | Hiramatsu et al. | |
| 2023/0110477 A1 | 4/2023 | Maki et al. | |
| 2023/0111032 A1 | 4/2023 | Goto et al. | |
| 2023/0111849 A1 | 4/2023 | Maki et al. | |
| 2023/0113099 A1 | 4/2023 | Goto et al. | |
| 2023/0117464 A1 | 4/2023 | Goto et al. | |
| 2023/0118194 A1 | 4/2023 | Goto et al. | |
| 2023/0119788 A1 | 4/2023 | Goto et al. | |
| 2023/0123285 A1 | 4/2023 | Goto et al. | |
| 2023/0163748 A1 | 5/2023 | Goto et al. | |
| 2023/0208376 A1 | 6/2023 | Goto et al. | |
| 2023/0208384 A1 | 6/2023 | Goto et al. | |
| 2023/0208389 A1 | 6/2023 | Goto et al. | |
| 2023/0208398 A1 | 6/2023 | Goto et al. | |
| 2023/0208399 A1 | 6/2023 | Goto et al. | |
| 2023/0223910 A1 | 7/2023 | Goto et al. | |
| 2023/0223917 A1 | 7/2023 | Goto et al. | |
| 2023/0223919 A1 | 7/2023 | Goto et al. | |
| 2023/0225212 A1 | 7/2023 | Goto et al. | |
| 2023/0291385 A1 | 9/2023 | Okamoto et al. | |
| 2023/0327645 A1 | 10/2023 | Goto et al. | |
| 2023/0336145 A1 | 10/2023 | Goto et al. | |
| 2023/0336147 A1 | 10/2023 | Feld et al. | |
| 2023/0336153 A1 | 10/2023 | Goto et al. | |
| 2023/0344403 A1 | 10/2023 | Goto et al. | |
| 2023/0344410 A1 | 10/2023 | Goto et al. | |
| 2023/0344416 A1 | 10/2023 | Chen et al. | |
| 2023/0361755 A1 | 11/2023 | Goto | |
| 2023/0370044 A1 | 11/2023 | Goto et al. | |
| 2023/0378937 A1 | 11/2023 | Goto et al. | |
| 2023/0396233 A1 | 12/2023 | Nakamura et al. | |
| 2023/0403939 A1 | 12/2023 | Goto et al. | |
| 2024/0007079 A1 | 1/2024 | Goto et al. | |
| 2024/0039507 A1 | 2/2024 | Goto et al. | |
| 2024/0039516 A1 | 2/2024 | Goto et al. | |
| 2024/0048125 A1 | 2/2024 | Goto et al. | |
| 2024/0063773 A1 | 2/2024 | Fukuhara et al. | |
| 2024/0088870 A1 | 3/2024 | Goto et al. | |
| 2024/0178812 A1 | 5/2024 | Goto et al. | |
| 2024/0178814 A1 | 5/2024 | Goto et al. | |
| 2024/0223152 A1 | 7/2024 | Goto et al. | |
| 2025/0294839 A1 | 9/2025 | Song et al. | |

FOREIGN PATENT DOCUMENTS

| | | |
|---|---|---|
| JP | 2006-101092 A | 4/2006 |
| JP | 2023-174110 A | 12/2023 |
| WO | 2015/098679 A1 | 7/2015 |
| WO | 2020/098481 A1 | 5/2020 |
| WO | 2022/022264 A1 | 2/2022 |

OTHER PUBLICATIONS

Machine Translation of Japanese Patent Publication, JP 2006-101092, Oct. 2025 (Year: 2025).

Yantchev et al, "Micromachined thin film plate acoustic resonators utilizing the lowest order symmetric lamb wave mode," in IEEE Transactions on Ultrasonics, Ferroelectrics, and Frequency Control, vol. 54, No. 1, pp. 87-95, Jan. 2007. (Year: 2007).

* cited by examiner

2d 44
14
10

18    19
44c    44d
10A    10A
44a    44
44b
16    17

Tr1   dB: S(1,2)SCALE:   10.00/Div Ref   −70.00dB
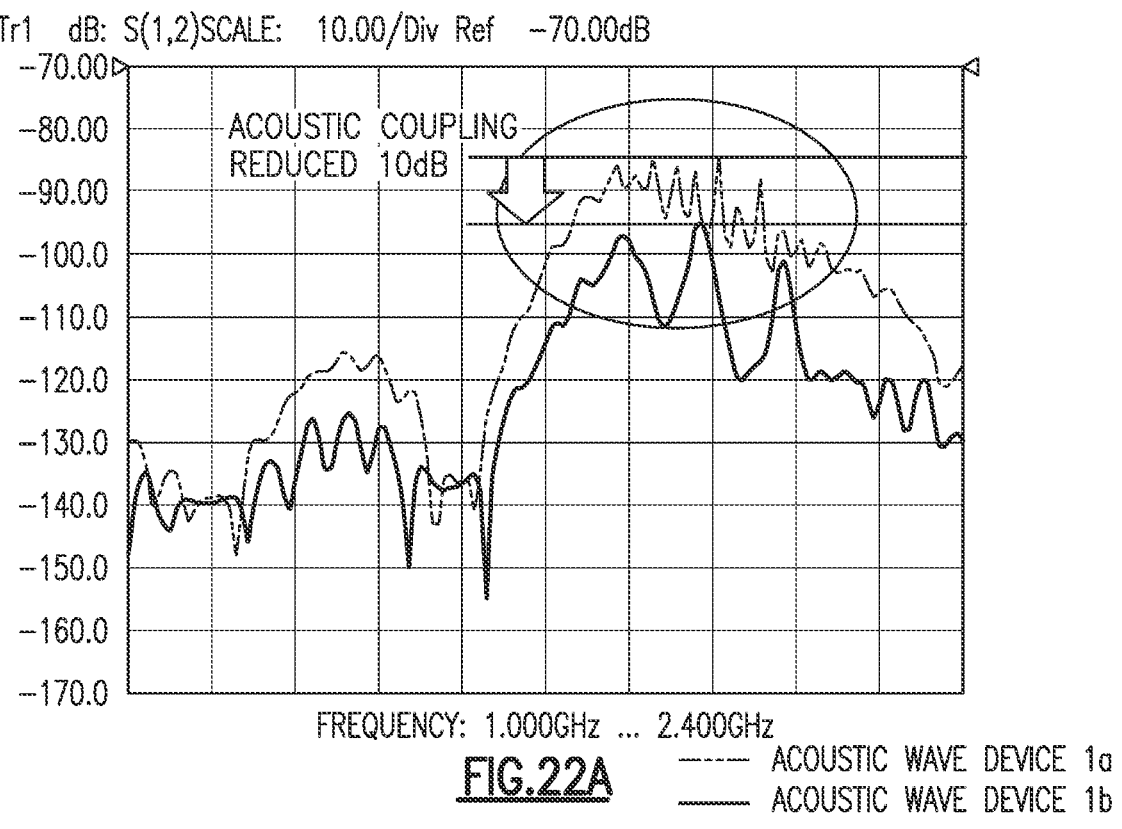
FREQUENCY: 1.000GHz ... 2.400GHz
FIG.22A          ----- ACOUSTIC WAVE DEVICE 1a
                     _____ ACOUSTIC WAVE DEVICE 1b
Tr1   dB: S(1,2)SCALE:   10.00/Div Ref   0.000dB
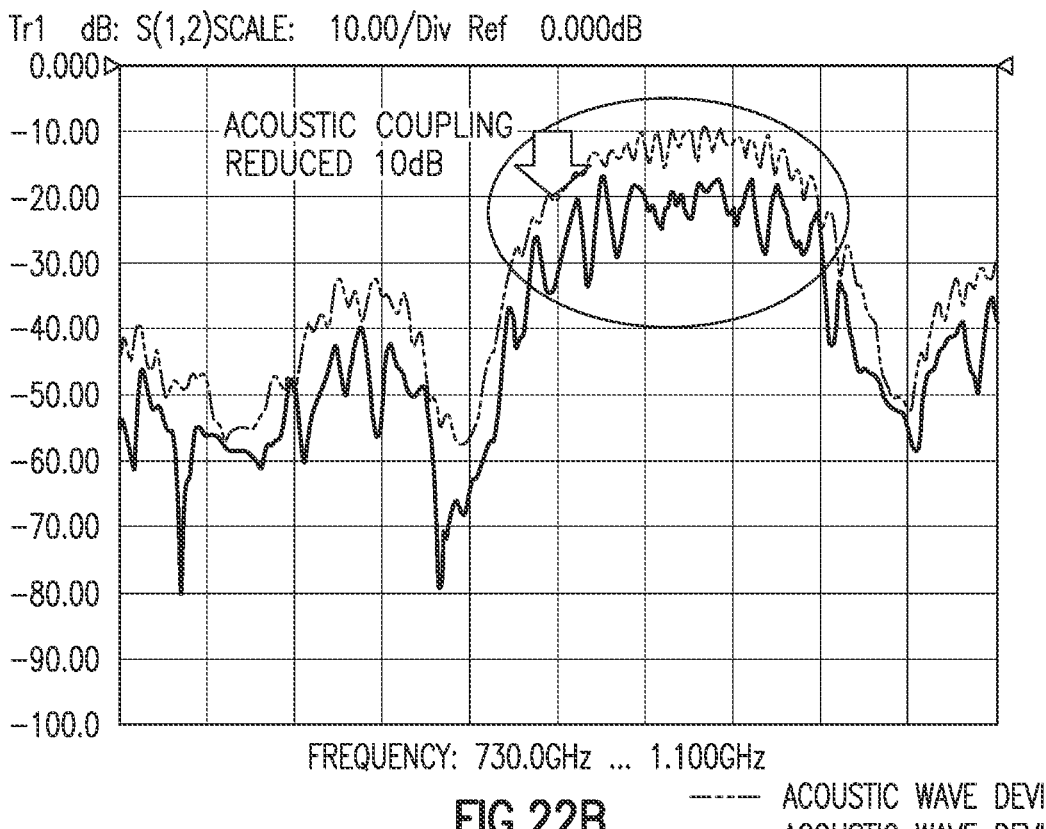
FREQUENCY: 730.0GHz ... 1.100GHz
FIG.22B          ----- ACOUSTIC WAVE DEVICE 1a
                     _____ ACOUSTIC WAVE DEVICE 1b

ACOUSTIC WAVE DEVICE WITH REDUCED ACOUSTIC COUPLING

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/217,121, filed Jun. 30, 2021, titled "ACOUSTIC WAVE DEVICE WITH REDUCED ACOUS-TIC COUPLING," and U.S. Provisional Patent Application No. 63/217,101, filed Jun. 30, 2021, titled "METHOD OF FORMING ACOUSTIC WAVE DEVICE WITH REDUCED ACOUSTIC COUPLING," are hereby incorpo-rated by reference under 37 CFR 1.57 in their entirety. Also, this application relates to U.S. Pat. No. 10,483,942, the entire content of which is incorporated by reference herein in its entirety and for all purposes.

BACKGROUND

Technical Field

Embodiments of this disclosure relate to acoustic wave devices.

Description of Related Technology

An acoustic wave filter can include a plurality of resona-tors arranged to filter a radio frequency signal. Example acoustic wave filters include surface acoustic wave (SAW) filters and bulk acoustic wave (BAW) filters. A multi-layer piezoelectric layer (MPS) SAW filter is an example of a SAW filter. A film bulk acoustic resonator (FBAR) filter is an example of a BAW filter.

Acoustic wave filters can be implemented in radio fre-quency electronic systems. For instance, filters in a radio frequency front end of a mobile phone can include acoustic wave filters. Two acoustic wave filters can be arranged as a duplexer.

SUMMARY

The innovations described in the claims each have several aspects, no single one of which is solely responsible for its desirable attributes. Without limiting the scope of the claims, some prominent features of this disclosure will now be briefly described.

In one aspect, an acoustic wave device is disclosed. The acoustic wave device can include a support substrate that includes a first substrate portion, a second substrate portion, and a third substrate portion between the first substrate portion and the second substrate portion. The acoustic wave device can include a piezoelectric layer that includes a first portion over the first substrate portion and a second portion over the second substrate portion. The piezoelectric layer is arranged such that a region over the third substrate portion is free from the piezoelectric layer. The acoustic wave device can include a first interdigital transducer electrode on the first portion of the piezoelectric layer, and a second interdigital transducer electrode on the second portion of the piezoelectric layer.

In one embodiment, an etched portion of the piezoelectric layer defines the region over the third substrate portion that is free from the piezoelectric layer.

In one embodiment, the second interdigital transducer electrode is positioned in a longitudinal direction of the first interdigital transducer electrode.

In one embodiment, the second interdigital transducer electrode is positioned in an acoustic propagation direction of the first interdigital transducer electrode.

In one embodiment, the acoustic wave device further includes an intermediate layer between the support substrate and the piezoelectric layer. The intermediate layer can include a first portion and a second portion under the first portion of the piezoelectric layer and the second portion of the piezoelectric layer respectively. The region over the third substrate portion that can be free from the piezoelectric layer is free from the intermediate layer.

In one embodiment, the acoustic wave device further includes an acoustic obstacle in the region over the third substrate portion. The acoustic obstacle can be arranged to absorb acoustic energy. The acoustic obstacle can include a polymer.

In one embodiment, the acoustic wave device further includes a patterned metal formed on the piezoelectric layer between the first interdigital transducer electrode and the second interdigital transducer electrode.

In one embodiment, edges of the first portion of the piezoelectric layer have non-straight edges.

In one embodiment, the first interdigital transducer elec-trode is tilted.

In one aspect, an acoustic wave device is disclosed. the acoustic wave device can include a support substrate that includes a first substrate portion, a second substrate portion, and a third substrate portion between the first substrate portion and the second substrate portion. The acoustic wave device can include a piezoelectric layer that includes a first portion over the first substrate portion and a second portion over the second substrate portion. The piezoelectric layer has a reduced thickness portion between the first portion and the second portion of the piezoelectric layer that has a reduced thickness relative to a thickness of the first portion or the second portion of the piezoelectric layer. The acoustic wave device can include a first interdigital transducer elec-trode on the first portion of the piezoelectric layer, and a second interdigital transducer electrode on the second por-tion of the piezoelectric layer.

In one embodiment, an etched portion of the piezoelectric layer defines a region over the third substrate portion that is free from the piezoelectric layer.

In one embodiment, the second interdigital transducer electrode is positioned in a longitudinal direction of the first interdigital transducer electrode.

In one embodiment, the second interdigital transducer electrode is positioned in an acoustic propagation direction of the first interdigital transducer electrode.

In one embodiment, the acoustic wave device further includes an intermediate layer between the support substrate and the piezoelectric layer. The intermediate layer can include a first substrate portion and a second substrate portion under the first portion of the piezoelectric layer and the second portion of the piezoelectric layer respectively. The region over the third substrate portion that can be free from the piezoelectric layer is free from the intermediate layer.

In one embodiment, the acoustic wave device further includes an acoustic obstacle in the region over the third substrate portion. The acoustic obstacle can be arranged to absorb acoustic energy.

In one aspect, a method of forming an acoustic wave device is disclosed. The method can include providing a structure that has a support substrate that includes a first substrate portion, a second substrate portion, and a third substrate portion between the first portion and the second portion, a piezoelectric layer that includes a first portion over the first substrate portion and a second portion over the second substrate portion, a first interdigital transducer electrode on the first portion of the piezoelectric layer, and a second interdigital transducer electrode on the second portion of the piezoelectric layer. The method can include etching at least a portion of the piezoelectric layer such that a region over the third substrate portion is free from the piezoelectric layer.

In one embodiment, the second interdigital transducer electrode is positioned in a longitudinal direction of the first interdigital transducer electrode.

In one embodiment, the second interdigital transducer electrode is positioned in an acoustic propagation direction of the first interdigital transducer electrode.

In one embodiment, the structure further includes an intermediate layer between the support substrate and the piezoelectric layer. The intermediate layer can include a first portion and a second portion under the first portion of the piezoelectric layer and the second portion of the piezoelectric layer respectively. The region over the third substrate portion that is free from the piezoelectric layer can be free from the intermediate layer.

In one embodiment, the method further includes providing an acoustic obstacle in the region over the third substrate portion, wherein the acoustic obstacle is arranged to absorb acoustic energy. The acoustic obstacle can include a polymer.

In one embodiment, the method further includes forming a patterned metal on the piezoelectric layer between the first interdigital transducer electrode and the second interdigital transducer electrode.

In one embodiment, the etching includes shaping edges of the first portion of the piezoelectric layer to have non-straight edges.

In one embodiment, the first interdigital transducer electrode is tilted.

In one aspect, a method of forming an acoustic wave device is disclosed. The method can include providing a structure that has a support substrate that includes a first substrate portion, a second substrate portion, and a third substrate portion between the first portion and the second portion, a piezoelectric layer that includes a first portion over the first substrate portion, a second portion over the second substrate portion, and a third portion over the third substrate portion, a first interdigital transducer electrode on the first portion of the piezoelectric layer, and a second interdigital transducer electrode on the second portion of the piezoelectric layer. The method can include etching at least a portion of the third portion of the piezoelectric layer to form a reduced thickness portion in the piezoelectric layer between the first portion and the second portion of the piezoelectric layer that has a reduced thickness relative to a thickness of the first portion or the second portion of the piezoelectric layer.

In one embodiment, the second interdigital transducer electrode is positioned in a longitudinal direction of the first interdigital transducer electrode.

In one embodiment, the second interdigital transducer electrode is positioned in an acoustic propagation direction of the first interdigital transducer electrode.

In one embodiment, the structure further includes an intermediate layer between the support substrate and the piezoelectric layer. The intermediate layer includes a first portion and a second portion under the first portion of the piezoelectric layer and the second portion of the piezoelectric layer respectively. A region over the third substrate portion that is free from the piezoelectric layer can be free from the intermediate layer. The method can further include providing an acoustic obstacle in the region over the third substrate portion, wherein the acoustic obstacle is arranged to absorb acoustic energy. The acoustic obstacle can include a polymer.

In one embodiment, the method of further includes forming a patterned metal on the piezoelectric layer between the first interdigital transducer electrode and the second interdigital transducer electrode.

In one embodiment, the etching includes shaping edges of the first portion of the piezoelectric layer to have non-straight edges.

In one embodiment, the first interdigital transducer electrode is tilted.

In one aspect, an acoustic wave device is disclosed. The acoustic wave device can include a support substrate that includes a first substrate portion, a second substrate portion, and a third substrate portion between the first substrate portion and the second substrate portion. The acoustic wave device can include a piezoelectric layer that includes a first portion over the first substrate portion and a second portion over the second substrate portion, a filter circuit formed on the first portion of the piezoelectric layer, a cancelation circuit formed on the second portion of the piezoelectric layer. The acoustic wave device can include an acoustic obstruction structure that is disposed laterally between the first portion and the second portion of the piezoelectric layer. The acoustic obstruction structure is configured to reduce acoustic coupling between the filter circuit and the cancelation circuit.

In one embodiment, the acoustic obstruction structure includes a gap between the first portion of the piezoelectric layer and the second portion of the piezoelectric layer that is free from the piezoelectric layer. The acoustic obstruction structure can further include a polymer wall.

In one embodiment, the acoustic obstruction structure is positioned between a resonator of the filter circuit and a resonator of the cancelation circuit.

In one embodiment, the filter circuit includes a first filter portion and a second filter portion. The first filter portion can be formed mainly of ladder filters. The second filter portion can include a multi-mode longitudinally coupled surface acoustic wave resonator.

In one embodiment, the acoustic wave device further includes an intermediate layer between the support substrate and the piezoelectric layer. The intermediate layer can include a first intermediate layer portion over the first substrate portion and a second intermediate layer portion over the second substrate portion. The acoustic obstruction structure can be disposed between the first intermediate layer portion and the second intermediate layer portion.

In one aspect, an acoustic wave device is disclosed. The acoustic wave device can include a support substrate that includes a first substrate portion, a second substrate portion, and a third substrate portion between the first substrate portion and the second substrate portion. The acoustic wave device can include a piezoelectric layer that includes a first portion over the first substrate portion and a second portion over the second substrate portion, the piezoelectric layer arranged such that a region over the third substrate portion is free from the piezoelectric layer. The acoustic wave device can include a filter circuit that is formed on the first portion of the piezoelectric layer, and a cancelation circuit that is formed on the second portion of the piezoelectric layer.

In one embodiment, an etched portion of the piezoelectric layer defines the region over the third substrate portion that is free from the piezoelectric layer.

In one embodiment, the cancelation circuit is positioned in a longitudinal direction of a resonator of the filter circuit.

In one embodiment, the cancelation circuit is positioned in an acoustic propagation direction of a resonator of the filter circuit.

In one embodiment, the acoustic wave device further includes an intermediate layer between the support substrate and the piezoelectric layer. The intermediate layer includes a first intermediate layer portion and a second intermediate layer portion under the first portion of the piezoelectric layer and the second portion of the piezoelectric layer respectively. The region over the third substrate portion that is free from the piezoelectric layer is free from the intermediate layer.

In one embodiment, the acoustic wave device further includes an acoustic obstacle in the region over the third substrate portion. The acoustic obstacle can be arranged to absorb acoustic energy. The acoustic obstacle can include a polymer wall.

In one embodiment, the acoustic wave device further includes a patterned metal formed on the piezoelectric layer between the filter circuit and the cancelation circuit.

In one embodiment, edges of the first portion of the piezoelectric layer have non-straight edges.

In one embodiment, a resonator of the filter circuit is tilted. The present disclosure relates to U.S. patent application Ser. No. 17/808,479, titled "METHOD OF FORMING ACOUSTIC WAVE DEVICE WITH REDUCED ACOUSTIC COUPLING," and U.S. patent application Ser. No. 17/808,484, titled "ACOUSTIC WAVE DEVICE WITH ACOUSTIC OBSTRUCTION STRUCTURE," filed on Jun. 23, 2022, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 22A shows a graph showing simulated transmission characteristics of the acoustic wave devices shown in FIGS. 4A-5B.

FIG. 22B shows a graph showing measured transmission characteristics of acoustic wave devices having structures of the acoustic wave devices shown in FIGS. 4A-5B.

DETAILED DESCRIPTION OF CERTAIN EMBODIMENTS

Figures 1A, 1B:
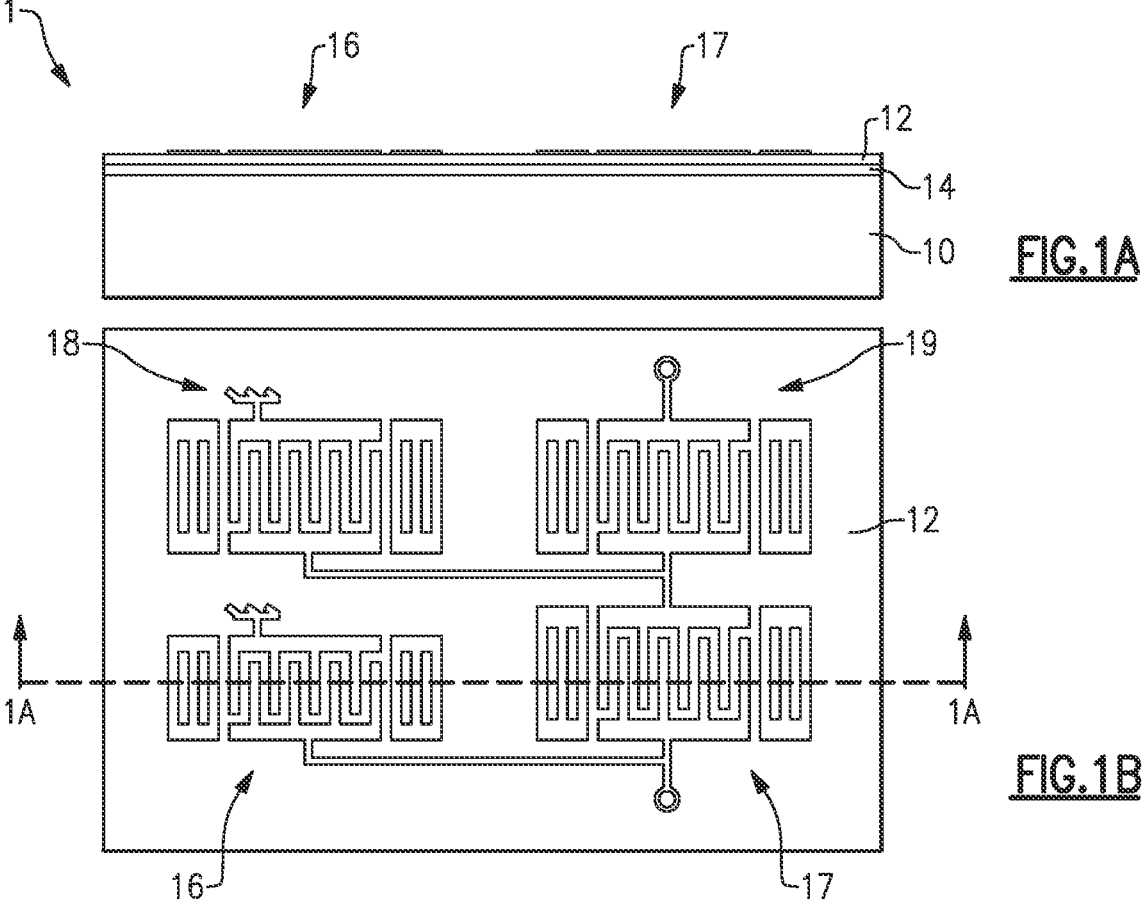
FIG. 1A is a schematic cross-sectional side view of an acoustic wave device.
FIG. 1B is a schematic top plan view of the acoustic wave device illustrated in FIG. 1A.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A feedback circuit, a ladder filter, a multi-mode longitudinally coupled SAW (e.g., a double mode SAW (DMS)) filter, and/or a coupled resonator filter (CRF) can include interdigital transducers (IDTs). To avoid or minimize the communication between IDTs, such IDTs can be implemented with physical layouts that are relatively far away from each other. However, the desire to minimize a filter die size can restrict options for designers to physically layout IDTs. In some instances, it is not possible to have IDTs with physical layouts sufficiently far away from each other to avoid communication between the IDTs.

Aspects of this disclosure relate to including an acoustic obstruction structure between IDTs of different feedback circuits to prevent or minimize acoustic communication between the IDTs of different feedback circuits. This can allow designers more flexibility in the physical layout of the feedback circuits. Aspects of this disclosure also relate to including an acoustic obstruction structure between IDTs in a ladder filter, between IDTs in a double mode SAW (DMS) filter, or between a feedback circuit and a main filter, to prevent or minimize the communication between the IDTs.

To improve multi-frequency band rejection, several IDTs of feedback circuits for each rejection band can be implemented. IDTs of different feedback circuits can communicate with each other by acoustic coupling. Accordingly, an unwanted response can be excited and degrade the rejection performance of a filter. To overcome this problem, an acoustic obstruction structure can be positioned between IDTs. The acoustic obstruction structure can be, for example, a physical separation of portions of a piezoelectric layer to have a piezoelectric opening between the IDTs of different feedback circuits. The opening between the portions of the piezoelectric layer can be formed by way of, for example, etching.

Acoustic obstruction structures can be disposed between different IDTs in a filter, or canceling circuits arranged to cancel frequency components within different frequency bands. In some implementations, such obstruction structures can be implemented in an acoustic wave device that includes an acoustic wave filter coupled to the canceling circuits. For example, an obstruction structure can be positioned between a main filter circuit and the canceling circuit. The acoustic wave filter can be a surface acoustic wave filter. In some embodiments, the different canceling circuits can be coupled to both a transmit filter that includes first acoustic wave resonators and a receive filter that includes second acoustic wave resonators, in which the transmit filter and the receive filter are coupled to each other at a common node. According to certain embodiments, a surface acoustic wave device includes a surface acoustic wave filter, a multi-channel feedback circuit coupled to the surface acoustic wave filter, and an acoustic obstruction structure disposed between interdigital transducer electrodes of the multi-channel feedback circuit.

FIG. 1A is a schematic cross-sectional side view of an acoustic wave device 1. FIG. 1B is a schematic top plan view of the acoustic wave device 1 illustrated in FIG. 1A. The acoustic wave device 1 includes a support substrate 10, a piezoelectric layer 12 over the support substrate 10, an intermediate layer 14 between the support substrate 10 and the piezoelectric layer 12, and a first resonator 16, a second resonator 17, a third resonator 18 and a fourth resonator 19 over the piezoelectric layer 12. In the acoustic wave device 1, the intermediate layer 14 and the piezoelectric layer 12 covers an entire surface of the support substrate 10 including an area between the first resonator 16 and the second resonator 17 and an area between the third resonator 18 and the fourth resonator 19. An unwanted acoustic coupling may be caused between the first resonator 16 and the second resonator 17 because an acoustic wave from the first resonator 16 or the second resonator 17 can propagate to the other one of the first resonator 16 or the second resonator 17 through the intermediate layer 14 and/or the piezoelectric layer 12. An unwanted acoustic coupling may be caused between the third resonator 18 and the fourth resonator 19 because an acoustic wave from the third resonator 18 or the fourth resonator 19 can propagate to the other one of the third resonator 18 or the fourth resonator 19 through the intermediate layer 14 and/or the piezoelectric layer 12.

Figures 2A, 2B:
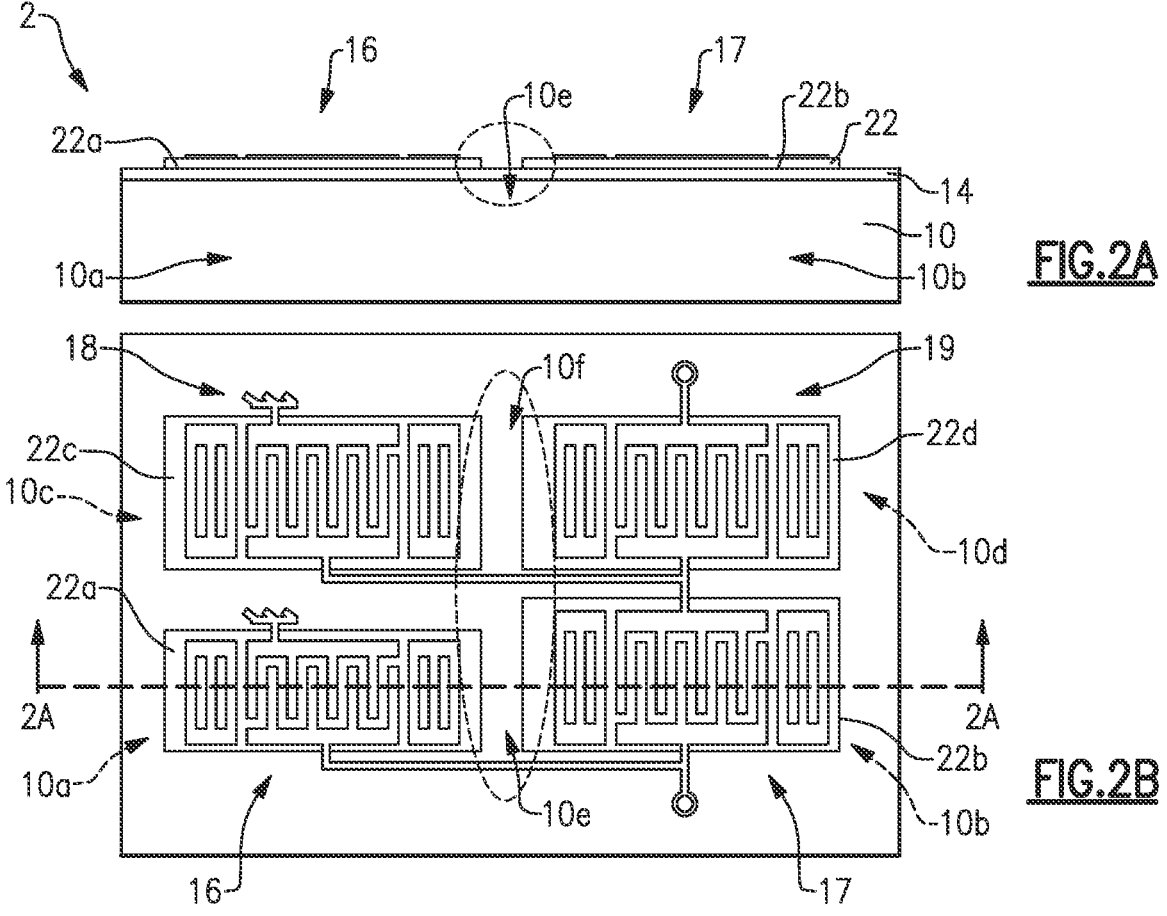
FIG. 2A is a schematic cross-sectional side view of an acoustic wave device, according to an embodiment.
FIG. 2B is a schematic top plan view of the acoustic wave device illustrated in FIG. 2A.

FIG. 2A is a schematic cross-sectional side view of an acoustic wave device 2, according to an embodiment. FIG. 2B is a schematic top plan view of the acoustic wave device 2 illustrated in FIG. 2A.

The acoustic wave device 2 includes a support substrate 10, a piezoelectric layer 22 over the support substrate 10, an intermediate layer 14 between the support substrate 10 and the piezoelectric layer 22, and a first resonator 16, a second resonator 17, a third resonator 18 and a fourth resonator 19 over the piezoelectric layer 22. Unlike the piezoelectric layer 12 of the acoustic wave device 1 illustrated in FIGS. 1A and 1B, the piezoelectric layer 22 include separate portions (a first portion 22a, a second portion 22b, a third portion 22c, and a fourth portion 22d) that are spaced apart from each other. In some embodiments, the portions of the piezoelectric layer 22 can be physically separated by gaps therebetween, and the gaps can be free from the piezoelectric layer 22. In such embodiments, the intermediate layer 14 can be exposed through the gaps. In some other embodiments, the portions of the piezoelectric layer 22 can be physically separated by gaps therebetween, and the gaps can have the piezoelectric layer 22 with a reduced thickness (not shown) relative to thicknesses of the first portion 22a, the second portion 22b, the third portion 22c, and the fourth portion 22d.

In some embodiments, the support substrate 10 can be a single crystal layer. In some embodiments, the support substrate 10 can be a silicon support substrate. In some other embodiments, the support substrate 10 can include, for example, sapphire, aluminum oxide ($Al_2O_3$), aluminum nitride (AlN), ceramic material, quartz etc. The support substrate 10 can have a high impedance relative to the piezoelectric layer 12 and high thermal conductivity. For example, the support substrate 10 can have a higher impedance than an impedance of the piezoelectric layer 12 and a higher thermal conductivity than a thermal conductivity of the piezoelectric layer 12.

The support substrate 10 can have substrate portions (a first substrate portion 10a, a second substrate portion 10b, a third substrate portion 10c, and a fourth substrate portion 10d) under respective portions (the first portion 22a, the second portion 22b, the third portion 22c, and the fourth portion 22d) of the piezoelectric layer 22. The support substrate 10 can also have a fifth substrate portion 10e between the first substrate portion 10a and the second substrate portion 10b, and a sixth substrate portion 10f between the third substrate portion 10c and the fourth substrate portion 10d. The gap between the first portion 22a and the second portion 22b can overlap with the fifth substrate portion 10e, and the gap between the third portion 22c and the fourth portion 22d can overlap with the sixth substrate portion 10f, such that regions over the fifth substrate portion 10e and the sixth substrate portion 10f can be free from the piezoelectric layer 22.

In some embodiments, the intermediate layer 14 can act as an adhesive layer. The intermediate layer 14 can include any suitable material. The intermediate layer 14 can be, for example, an oxide layer (e.g., a silicon dioxide ($SiO_2$) layer). In the acoustic wave device 2 illustrated in FIGS. 2A and 2B, the intermediate layer 14 can cover an entire surface of the support substrate 10, including the regions over the fifth substrate portion 10e and the sixth substrate portion 10f.

The piezoelectric layer 12 can be any suitable piezoelectric layer, such as a lithium based piezoelectric layer. In some embodiments, the piezoelectric layer 12 can be a lithium tantalate (LT) layer. In some other embodiments, the piezoelectric layer 12 can be a lithium niobate (LN) layer.

The gap is an example of an obstruction structure. The gaps of the piezoelectric layer 12 can be formed by way of a removing process. For example, the gaps can be formed by way of etching. In such embodiments, the gaps can be referred to as etched regions. In some embodiments, the etched regions can have a structural signature of the etching process. The structural signature can be visibly observed by a skilled artisan. As will be described relative to various embodiments below, the piezoelectric layer 12 can be selectively removed. In some embodiments, the selection can be made based at least in part on the arrangements of the resonators. For example, a region that is located in an acoustic wave propagation direction and/or in a longitudinal direction of a resonator can be selected to be removed.

Figures 3A, 3B:
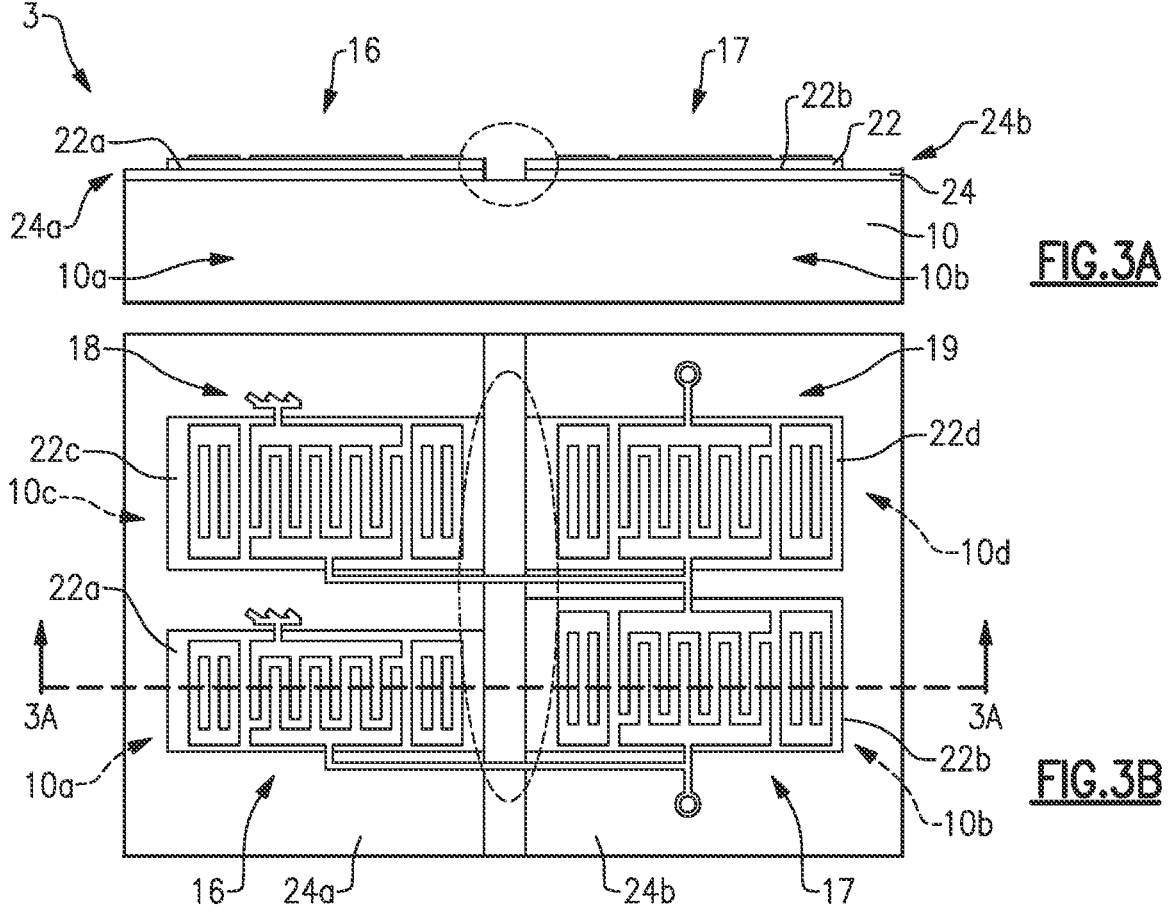
FIG. 3A is a schematic cross-sectional side view of an acoustic wave device, according to another embodiment.
FIG. 3B is a schematic top plan view of the acoustic wave device illustrated in FIG. 3A.

FIG. 3A is a schematic cross-sectional side view of an acoustic wave device 3, according to an embodiment. FIG. 3B is a schematic top plan view of the acoustic wave device 3 illustrated in FIG. 3A. Unless otherwise noted, components of the acoustic wave device 3 may be the same or generally similar to like components of any acoustic wave device disclosed herein.

The acoustic wave device 3 includes a support substrate 10, a piezoelectric layer 22 over the support substrate 10, an intermediate layer 24 between the support substrate 10 and the piezoelectric layer 22, and a first resonator 16, a second resonator 17, a third resonator 18 and a fourth resonator 19 over the piezoelectric layer 22. Unlike the intermediate layer 14 of the acoustic wave devices 1, 2 illustrated in FIGS. 1A-2B, the intermediate layer 24 include separate portions (a first portion 24a and a second portion 24b) that are spaced apart from each other. In some embodiments, the portions of the intermediate layer 24 can be physically separated by a gap therebetween, and the gap can be free from the intermediate layer 24. In such embodiments, the support substrate 10 can be exposed through the gap. In some other embodiments, the portions of the intermediate layer 24 can be physically separated by the gap therebetween, and the gap can have the intermediate layer 24 with a reduced thickness (see FIGS. 10E and 10F) relative to a thicknesses of the first portion 24a or the second portion 24b.

The first resonator 16 and the third resonator 18 can be positioned over the first portion 24a of the intermediate layer 24, and the second resonator 17 and the fourth resonator 19 can be positioned over the second portion 24b of the intermediate layer 24. The gap between the first portion 24a and the second portion 24b of the intermediate layer 24 can acoustically separate the first resonator 16 from the second resonator 17, and the third resonator 18 from the fourth resonator 19.

Figure 4A:
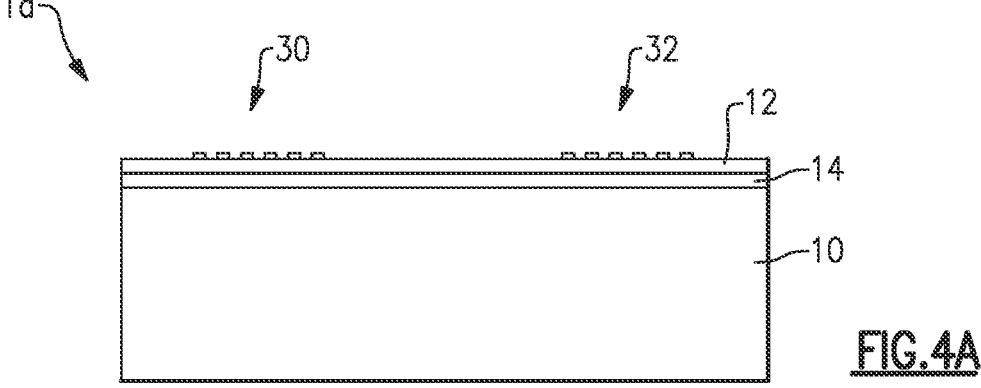
FIG. 4A is a schematic cross-sectional side view of an acoustic wave device.
Figure 4B:
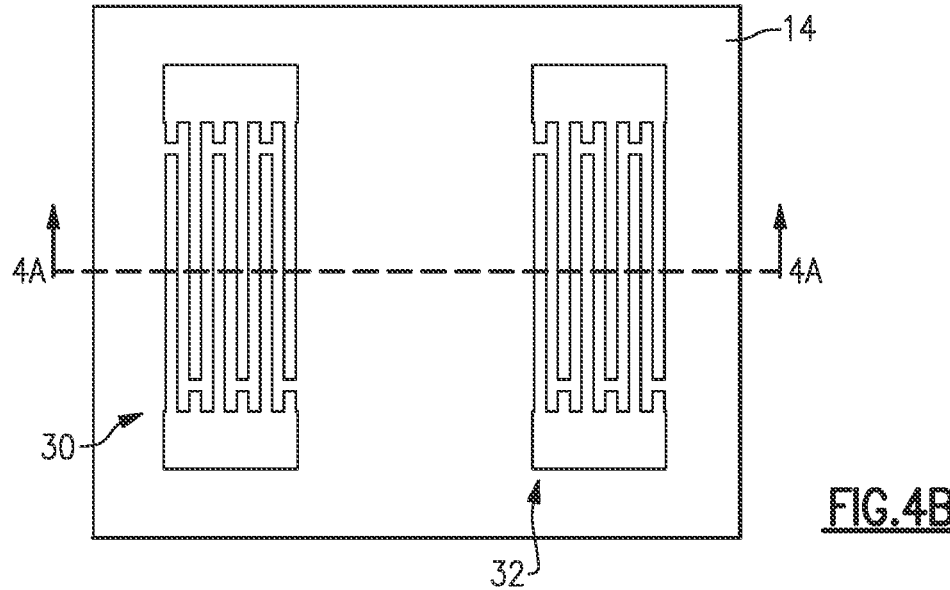
FIG. 4B is a schematic top plan view of the acoustic wave device illustrated in FIG. 4A.

FIGS. 4A-6B illustrate three different acoustic wave devices having structures similar to those shown in FIGS. 1A-3B, respectively. FIG. 4A is a schematic cross-sectional side view of an acoustic wave device 1a. FIG. 4B is a schematic top plan view of the acoustic wave device 1a illustrated in FIG. 4A. Like the acoustic wave device 1 illustrated in FIGS. 1A and 1B, the acoustic wave device 1a includes a support substrate 10, a piezoelectric layer 12 over the support substrate 10, and an intermediate layer 14 between the support substrate 10 and the piezoelectric layer 12. The acoustic wave device also includes a first interdigital transducer (IDT) electrode 30 and a second IDT electrode 32.

Figure 5A:
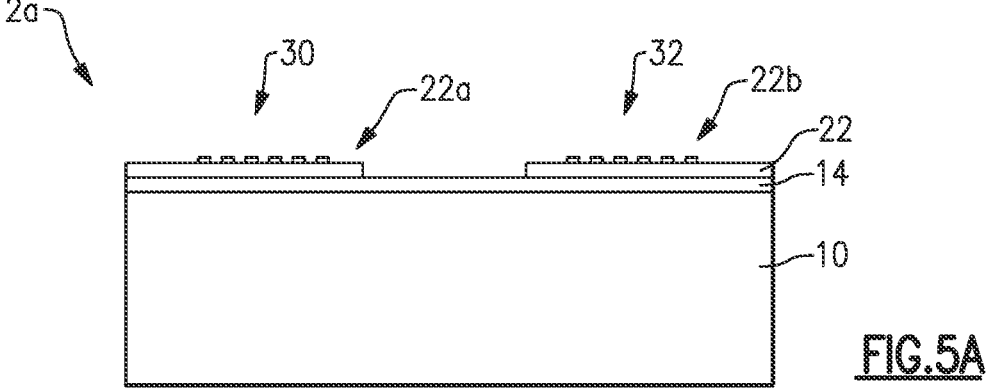
FIG. 5A is a schematic cross-sectional side view of an acoustic wave device according to an embodiment.
Figure 5B:
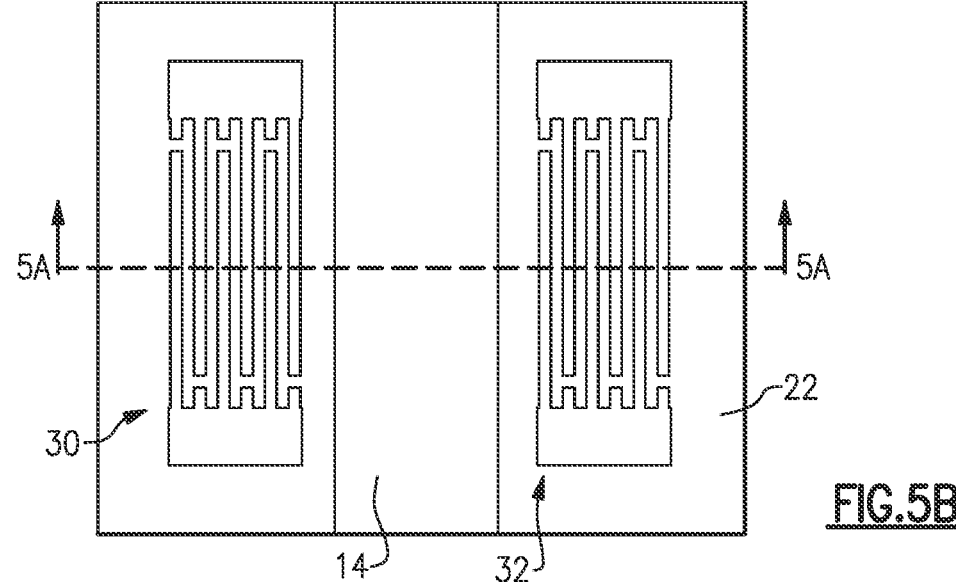
FIG. 5B is a schematic top plan view of the acoustic wave device illustrated in FIG. 5A.

FIG. 5A is a schematic cross-sectional side view of an acoustic wave device 2a according to an embodiment. FIG. 5B is a schematic top plan view of the acoustic wave device 2a illustrated in FIG. 5A. The acoustic wave device 2a includes a support substrate 10, a piezoelectric layer 22 over the support substrate 10, and an intermediate layer 14 between the support substrate 10 and the piezoelectric layer 22. The acoustic wave device also includes a first interdigital transducer (IDT) electrode 30 over a first portion 22a of the piezoelectric layer 22 and a second IDT electrode 32 over a second portion 22b of the piezoelectric layer 22.

Figure 6A:
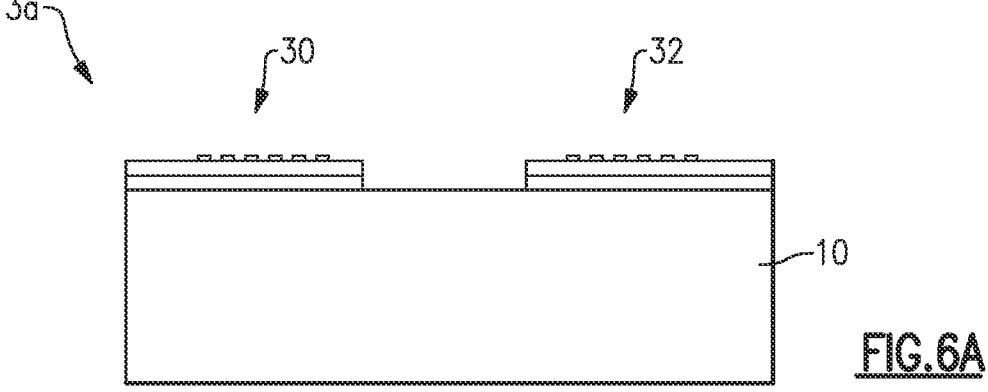
FIG. 6A is a schematic cross-sectional side view of an acoustic wave device according to another embodiment.
Figure 6B:
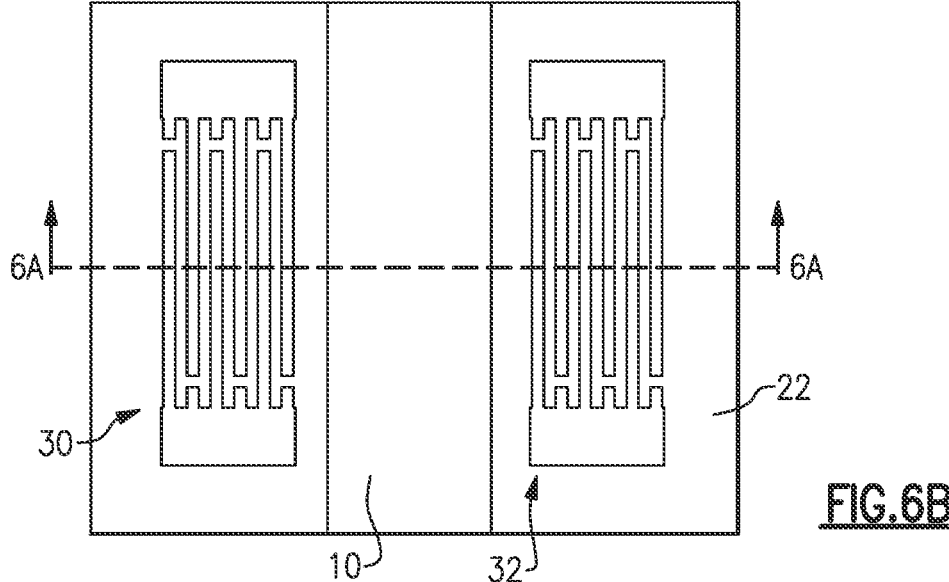
FIG. 6B is a schematic top plan view of the acoustic wave device illustrated in FIG. 6A.

FIG. 6A is a schematic cross-sectional side view of an acoustic wave device 3a according to an embodiment. FIG. 6B is a schematic top plan view of the acoustic wave device 3a illustrated in FIG. 6A. The acoustic wave device 3a includes a support substrate 10, a piezoelectric layer 22 over the support substrate 10, and an intermediate layer 24 between the support substrate 10 and the piezoelectric layer 22. The intermediate layer 24 includes a first portion 24a and a second portion 24b. The piezoelectric layer 22 can include a first portion 22a over the first portion 24a of the intermediate layer 24 and a second portion 22b over the second portion 24b of the intermediate layer. The acoustic wave device also includes a first interdigital transducer (IDT) electrode 30 over the first portion 22a of the piezoelectric layer 22 and a second IDT electrode 32 over the second portion 22b of the piezoelectric layer 22.

Figure 7:
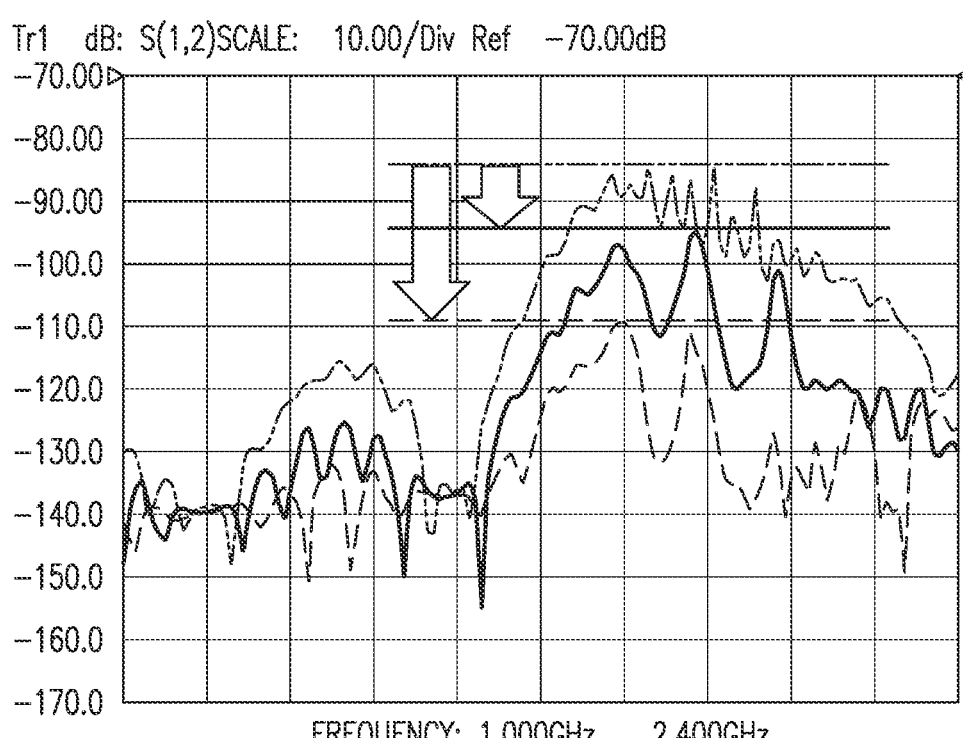
FIG. 7 is a graph showing simulated transmission characteristics of the acoustic wave devices shown in FIGS. 4A-6B.

FIG. 7 is a graph showing simulated transmission characteristics of the acoustic wave devices 1a, 2a, 3a shown in FIGS. 4A-6B. In the simulations, silicon (Si) is used for the support substrate 10, silicon dioxide (SiO$_2$) is used for the intermediate layer 14, 24, and lithium tantalate (LT) is used for the piezoelectric layer 12, 22. It can be observed from FIG. 7 that an acoustic coupling of the acoustic wave device 1b is reduced by about 10 dB relative to the acoustic wave device 1a. It can be observed from FIG. 7 that an acoustic coupling of the acoustic wave device 1c is reduced by about 20 dB relative to the acoustic wave device 1b. FIG. 7 illustrates that a separated piezoelectric layer (e.g., the piezoelectric layer 22) and/or a separated intermediate layer (e.g., the intermediate layer 24) can improve performance of the signal attenuation between the first IDT electrode 30 and the second IDT electrode 32. This result shows that the piezoelectric layer 22 and/or the intermediate layer 24 can prevent or mitigate the first IDT electrode 30 and the second IDT electrode 32 from communicating with each other by acoustic coupling. For instance, the graph of FIG. 7 indicates that the piezoelectric layer 22 and/or the intermediate layer 24 can suppress a relatively strong spike in the frequency response of an acoustic wave device.

FIGS. 8A-17B show variations of an acoustic wave device similar to the acoustic wave device 2 illustrated in FIGS. 2A and 2B. Each of these variations shown in FIGS. 8A-17B can be applied to or combined with any of the acoustic wave devices disclosed herein. The variations can be applied to any suitable acoustic wave device disclosed herein, such as the acoustic wave device 3.

Figures 8A, 8B:
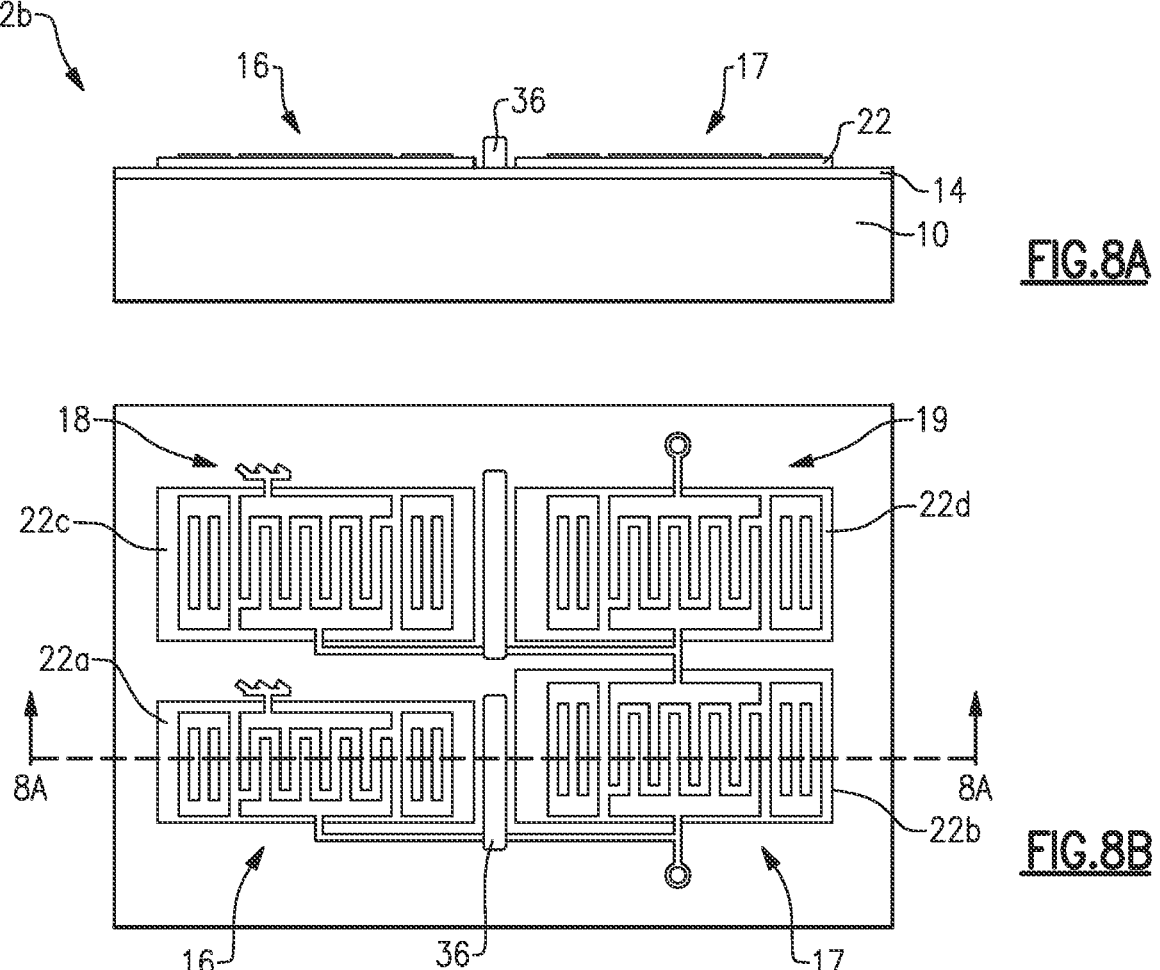
FIG. 8A is a schematic cross-sectional side view of an acoustic wave device according to an embodiment.
FIG. 8B is a schematic top plan view of the acoustic wave device illustrated in FIG. 8A.

FIG. 8A is a schematic cross-sectional side view of an acoustic wave device 2b according to an embodiment. FIG. 8B is a schematic top plan view of the acoustic wave device 2b illustrated in FIG. 8A. Like the acoustic wave device 2 illustrated in FIG. 2A and 2B, the acoustic wave device 2b includes a support substrate 10, a piezoelectric layer 22 over the support substrate 10, an intermediate layer 14 between the support substrate 10 and the piezoelectric layer 22, and a first resonator 16, a second resonator 17, a third resonator 18 and a fourth resonator 19 over the piezoelectric layer 22. The piezoelectric layer 22 include separate portions (a first portion 22a, a second portion 22b, a third portion 22c, and a fourth portion 22d) that are spaced apart from each other.

The acoustic wave device 2b can also include an acoustic obstacle 36. The acoustic obstacle 36 can be disposed between the first portion 22a and the second portion 22b, and between the third portion 22c and the fourth portion 22d. In the illustrated embodiment, the acoustic obstacle 36 is a polymer wall. In some embodiments, the acoustic obstacle 36 can include a metal pattern, a cavity pillar, a silicon dioxide grove, any other suitable obstacle, or any suitable combination thereof. The acoustic obstacle 36 can further reduce and/or eliminate acoustic coupling between the first resonator 16 and the second resonator 17, and between the third resonator 18 and the fourth resonator 19. The acoustic obstacle 36 can absorb and/or scatter acoustic energy. Additional descriptions of an acoustic obstacle may be found throughout U.S. Pat. No. 10,483,942, the entire content of which is incorporated by reference herein in its entirety and for all purposes.

Figures 9A, 9B:
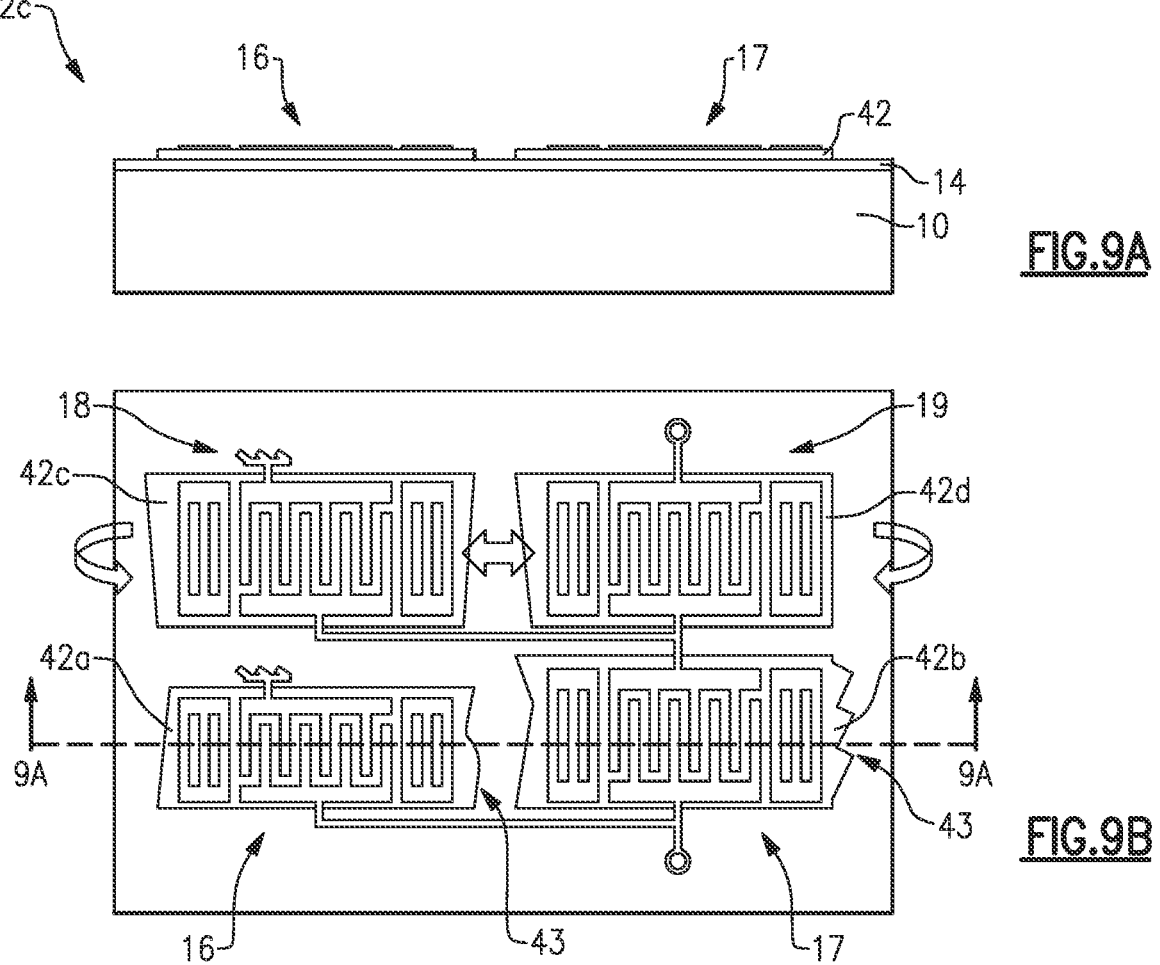
FIG. 9A is a schematic cross-sectional side view of an acoustic wave device according to another embodiment.
FIG. 9B is a schematic top plan view of the acoustic wave device illustrated in FIG. 9A.

FIG. 9A is a schematic cross-sectional side view of an acoustic wave device 2c according to an embodiment. FIG. 9B is a schematic top plan view of the acoustic wave device 2c illustrated in FIG. 9A. The acoustic wave device 2c is generally similar to the acoustic wave device 2 illustrated in FIGS. 2A and 2B, except that a piezoelectric layer 42 of the acoustic wave device 2c includes edges 43 that are shaped differently as compared to the piezoelectric layer 22 of the acoustic wave device 2. The piezoelectric layer 42 of the acoustic wave device 2c can include edges 43 that are shaped to further reduce unwanted coupling and/or unwanted reflection at or near edges 43 of the acoustic wave device 2c. In some embodiments, the edges 43 can be shaped to have non-straight edges and/or angled edges. The edges 43 can be shaped to have, for example, tapered edges, zigzag edges, curved edges (e.g., smoothly curved edges), etc. It can be advantageous to shape the edges 43 of the piezoelectric layer 42 that are located in an acoustic wave propagation direction of the wave generated by the resonator 16, 17, 18, 19, or located in a longitudinal direction of the resonator 16, 17, 18, 19 to reduce an acoustic coupling between the resonators 16, 17, 18, 19.

Figures 10A, 10B:
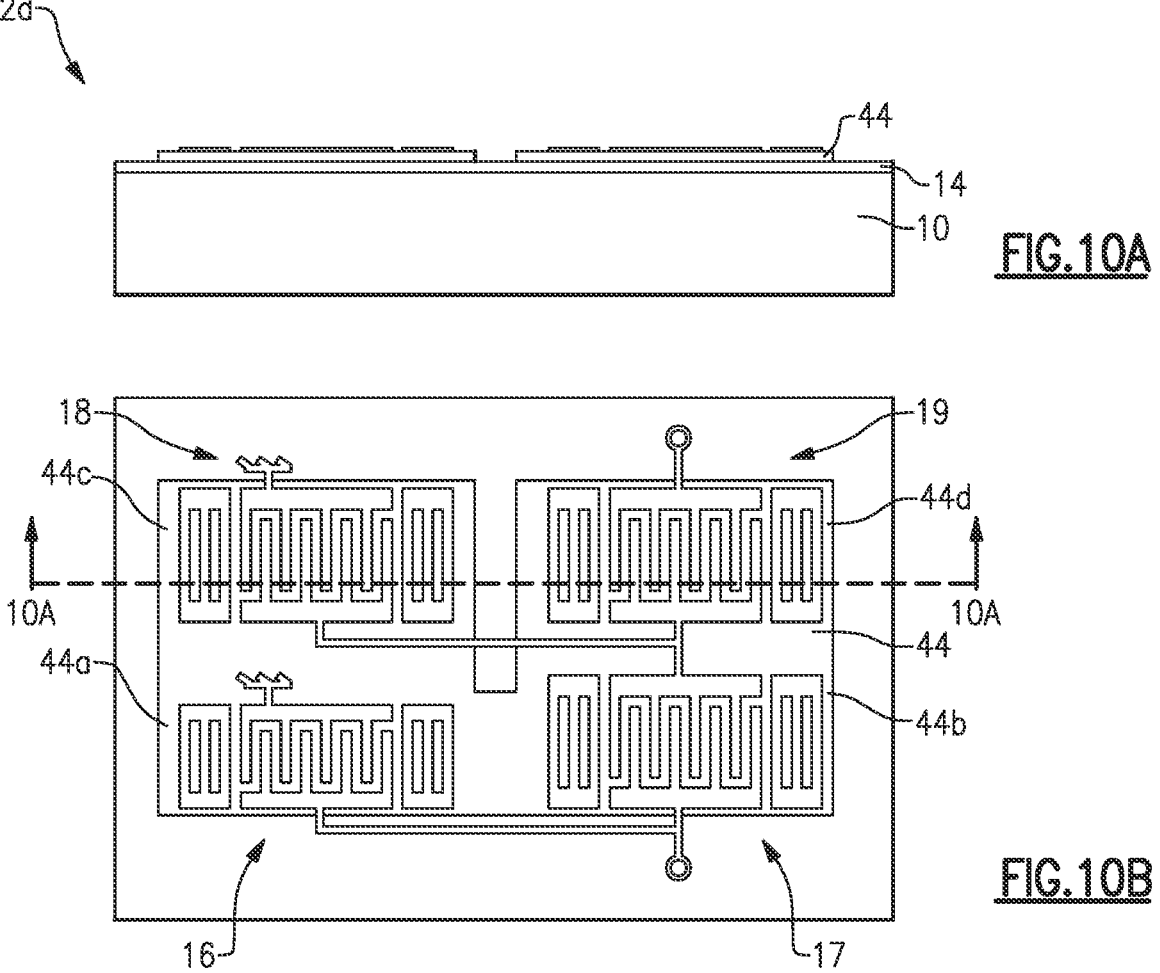
FIG. 10A is a schematic cross-sectional side view of an acoustic wave device according to another embodiment.
FIG. 10B is a schematic top plan view of the acoustic wave device illustrated in FIG. 10A.

FIG. 10A is a schematic cross-sectional side view of an acoustic wave device 2d according to an embodiment. FIG. 10B is a schematic top plan view of the acoustic wave device 2d illustrated in FIG. 10A. The acoustic wave device 2d is generally similar to the acoustic wave device 2 illustrated in FIGS. 2A and 2B, except that a first portion 44a and a second portion 44b of a piezoelectric layer 44 are connected by a region of the piezoelectric layer 44 in the acoustic wave device 2d. A third portion 44c and a fourth portion 44d of the piezoelectric layer 44 are separated. In certain embodiments of the acoustic wave device 2d, portions of the piezoelectric layer 44 can be selectively connected or separated to selectively reduce an acoustic coupling between certain resonators 16, 17, 18, 19 in the acoustic wave device 2d.

Figures 10C, 10D:
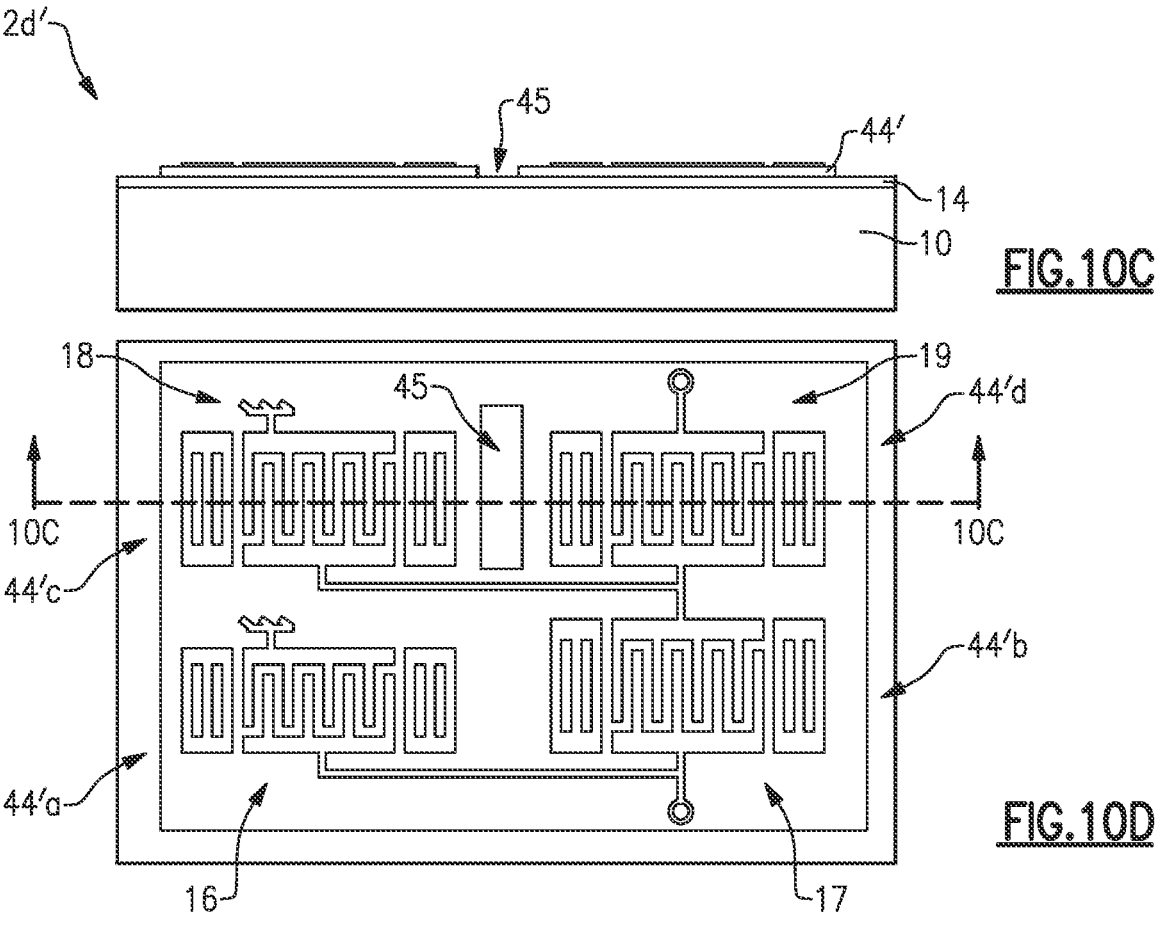
FIG. 10C is a schematic cross-sectional side view of an acoustic wave device according to another embodiment.
FIG. 10D is a schematic top plan view of the acoustic wave device illustrated in FIG. 10C.

FIG. 10C is a schematic cross-sectional side view of an acoustic wave device 2d∝ according to an embodiment. FIG. 10D is a schematic top plan view of the acoustic wave device 2d' illustrated in FIG. 10C. The acoustic wave device 2d' is generally similar to the acoustic wave device 2d illustrated in FIGS. 10A and 10B, except that a gap or slot 45 in a piezoelectric layer 44' is surrounded on each side by the piezoelectric layer 44'. The piezoelectric layer 44' includes a first to fourth portions 44'a, 44'b, 44'c, 44'd.

Figures 10E, 10F:
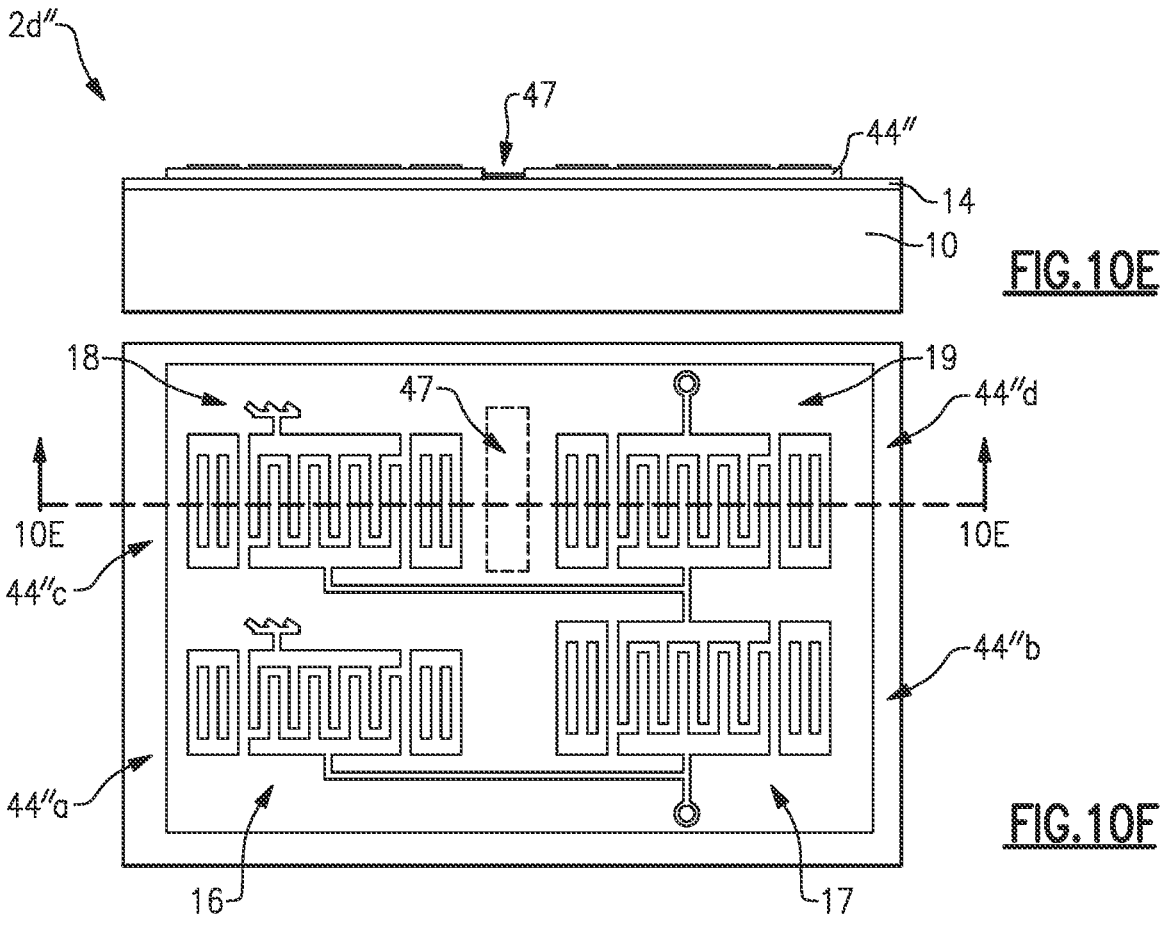
FIG. 10E is a schematic cross-sectional side view of an acoustic wave device according to another embodiment.
FIG. 10F is a schematic top plan view of the acoustic wave device illustrated in FIG. 10E.

FIG. 10E is a schematic cross-sectional side view of an acoustic wave device 2d" according to an embodiment. FIG. 10F is a schematic top plan view of the acoustic wave device 2d" illustrated in FIG. 10E. The acoustic wave device 2d" is generally similar to the acoustic wave device 2d' illustrated in FIGS. 10C and 10D, except that the acoustic wave device 2d" includes a reduced thickness portion 47 of a piezoelectric layer 44" in place of the slot 45 in a piezoelectric layer 44'. The piezoelectric layer 44" includes a first to fourth portions 44"a, 44"b, 44"c, 44"d. In the illustrated embodiment, the reduced thickness portion 47 is disposed between the third portion 44"c and the fourth portion 44"d of the piezoelectric layer 44", and the reduced thickness portion 47 can reduce and/or eliminate acoustic coupling between the third resonator 18 and the fourth resonator 19. In some embodiments, the reduced thickness portion 47 can be disposed between the first portion 44"*a* and the second portion 44"*b* of the piezoelectric layer 44".

Figures 11A, 11B:
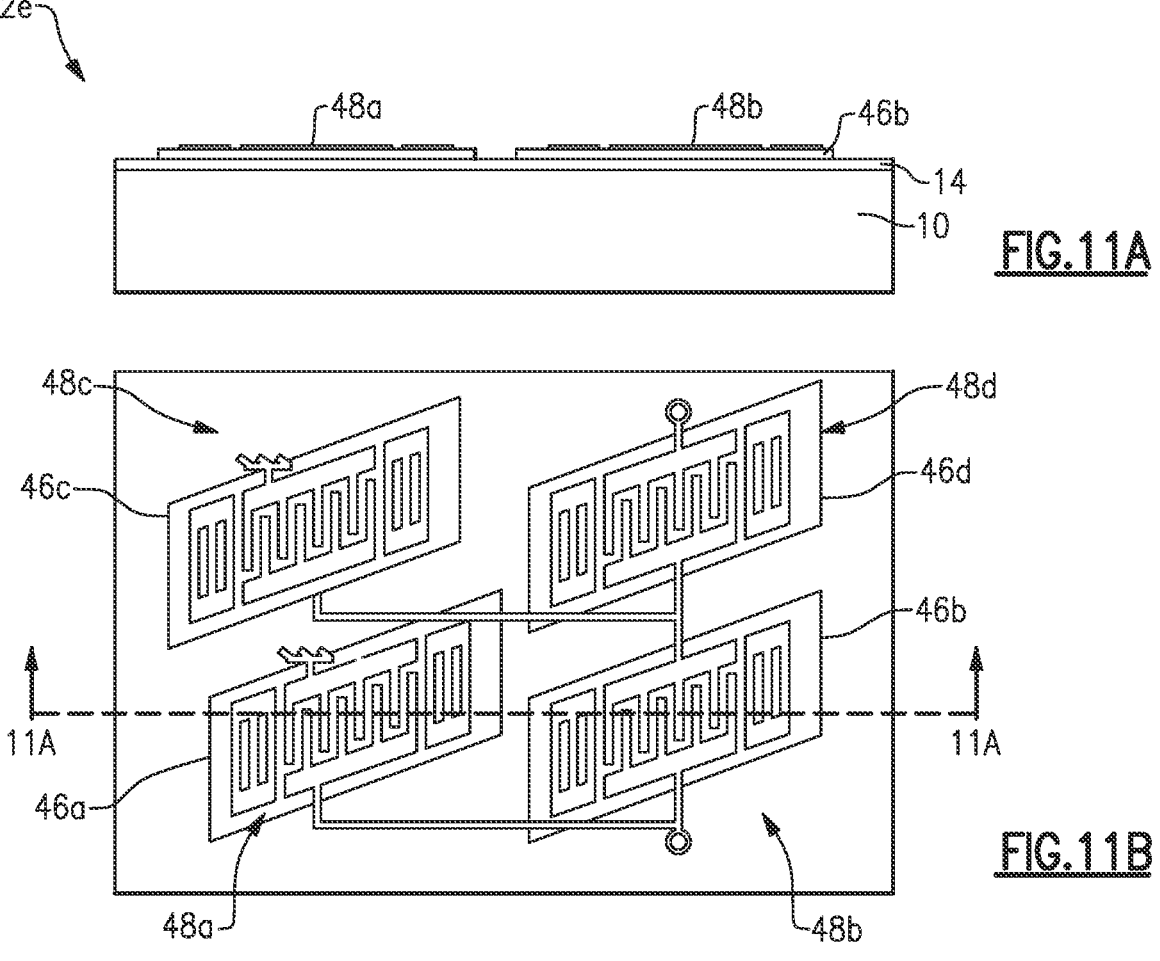
FIG. 11A is a schematic cross-sectional side view of an acoustic wave device according to another embodiment.
FIG. 11B is a schematic top plan view of the acoustic wave device illustrated in FIG. 11A.

FIG. 11A is a schematic cross-sectional side view of an acoustic wave device 2*e* according to an embodiment. FIG. 11B is a schematic top plan view of the acoustic wave device 2*e* illustrated in FIG. 11A. The acoustic wave device 2*e* is generally similar to the acoustic wave device 2 illustrated in FIGS. 2A and 2B, except that resonators (e.g., a first resonator 48*a*, a second resonator 48*b*, a third resonator 48*c*, and a fourth resonator 48*d*) and respective portions (e.g., a first portion 46*a*, a second portion 46*b*, a third portion 46*c*, and a fourth portion 46*d*) of a piezoelectric layer 46 can be slanted or tilted. The IDT electrodes of the resonators (a first resonator 48*a*, a second resonator 48*b*, a third resonator 48*c*, and a fourth resonator 48*d*) are tilted relative to the IDT electrode of the resonators illustrated in FIGS. 2A and 2B.

It can be advantageous to have gaps between the portions (the first portion 46*a*, the second portion 46*b*, the third portion 46*c*, and the fourth portion 46*d*) of the piezoelectric layer 46 such that the gaps are located in an acoustic wave propagation direction of the wave generated by the resonators (the first resonator 48*a*, the second resonator 48*b*, the third resonator 48*c*, and the fourth resonator 48*d*), or located in a longitudinal direction of the resonators (the first resonator 48*a*, the second resonator 48*b*, the third resonator 48*c*, and the fourth resonator 48*d*).

Figures 12A, 12B:
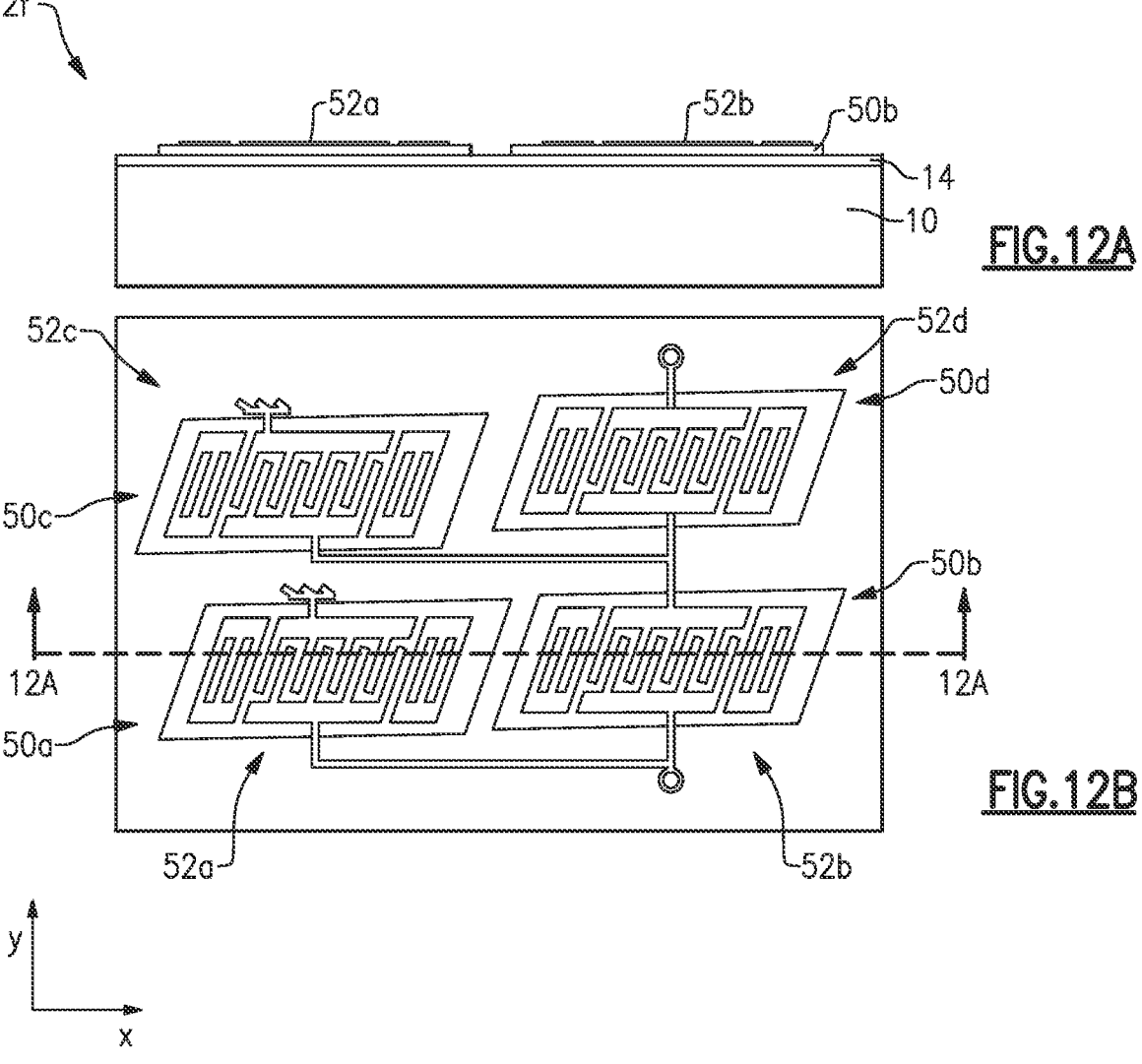
FIG. 12A is a schematic cross-sectional side view of an acoustic wave device according to another embodiment.
FIG. 12B is a schematic top plan view of the acoustic wave device illustrated in FIG. 12A.

FIG. 12A is a schematic cross-sectional side view of an acoustic wave device 2*f* according to an embodiment. FIG. 12B is a schematic top plan view of the acoustic wave device 2*f* illustrated in FIG. 12A. The acoustic wave device 2*f* is generally similar to the acoustic wave device 2*e* illustrated in FIGS. 11A and 11B. The IDT electrode of resonators (e.g., a first resonator 52*a*, a second resonator 52*b*, a third resonator 52*c*, and a fourth resonator 52*d*) are tilted and rotated relative to the IDT electrode of the acoustic resonator 2 illustrated in FIGS. 2A and 2B. Accordingly, (a) both the bus bar and fingers of the IDT electrode are rotated relative to the horizontal reference axis (the illustrated x-axis) and (b) the bus bar is tilted by a non-zero angle relative to the fingers of the IDT electrode.

It can be advantageous to have gaps between portions (a first portion 50*a*, a second portion 50*b*, a third portion 50*c*, and a fourth portion 50*d*) of a piezoelectric layer 50 such that the gaps are located in an acoustic wave propagation direction of the wave generated by the resonators (the first resonator 52*a*, the second resonator 52*b*, the third resonator 52*c*, and the fourth resonator 52*d*), or located in a longitudinal direction of the resonators (the first resonator 52*a*, the second resonator 52*b*, the third resonator 52*c*, and the fourth resonator 52*d*).

Figures 13A, 13B:
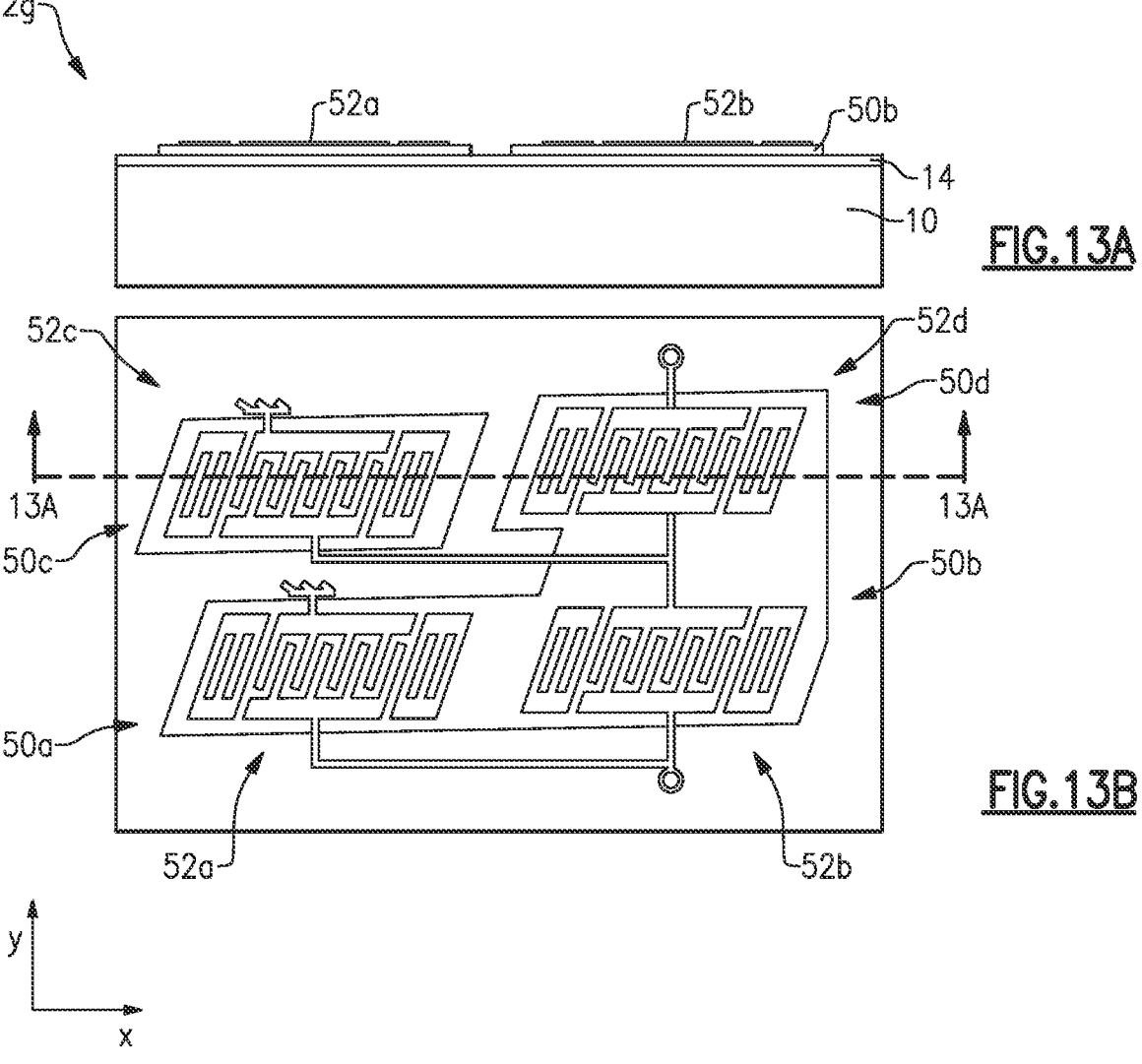
FIG. 13A is a schematic cross-sectional side view of an acoustic wave device according to another embodiment.
FIG. 13B is a schematic top plan view of the acoustic wave device illustrated in FIG. 13A.

FIG. 13A is a schematic cross-sectional side view of an acoustic wave device 2*g* according to an embodiment. FIG. 13B is a schematic top plan view of the acoustic wave device 2*g* illustrated in FIG. 13A. FIGS. 13A and 13B illustrates that various combinations of the features disclosed with respect to FIGS. 10A, 10B, 12A, and 12B are possible. In other words, one or more portions (the first portion 50*a*, the second portion 50*b*, the third portion 50*c*, and the fourth portion 50*d*) of the piezoelectric layer 50 illustrated in FIGS. 12A and 12B can be selectively connected as described with respect to FIGS. 10A and 10B. In the illustrated embodiment, the first portion 50*a*, the second portion 50*b*, and the third portion 50*c* are connected.

Figures 14A, 14B:
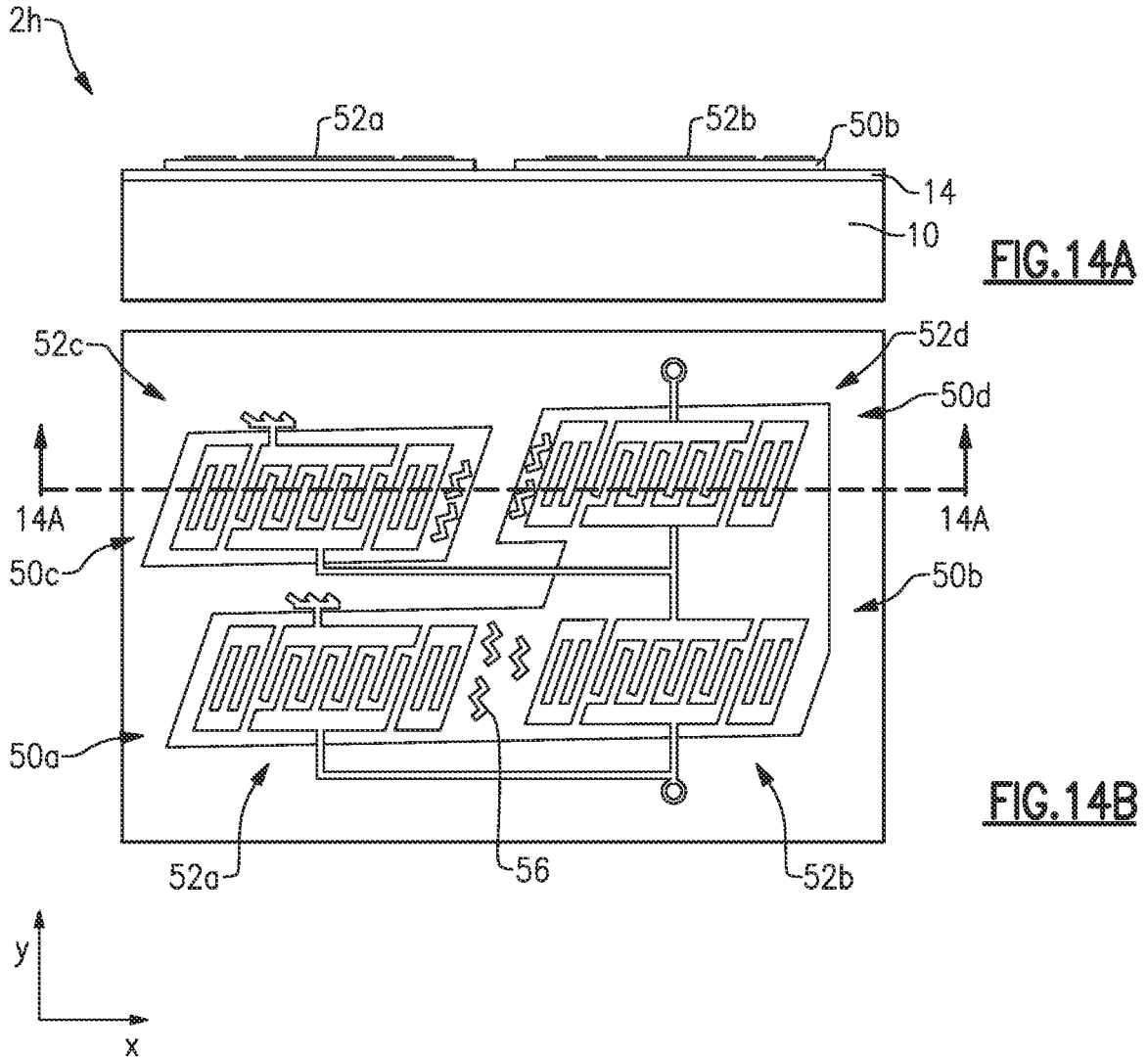
FIG. 14A is a schematic cross-sectional side view of an acoustic wave device according to another embodiment.
FIG. 14B is a schematic top plan view of the acoustic wave device illustrated in FIG. 14A.

FIG. 14A is a schematic cross-sectional side view of an acoustic wave device 2*h* according to an embodiment. FIG. 14B is a schematic top plan view of the acoustic wave device 2*h* illustrated in FIG. 14A. The acoustic wave device 2*h* is generally similar to the acoustic wave device 2*g* illustrated in FIGS. 13A and 13B, except that the acoustic wave device 2*h* also includes acoustic obstacles 56. In some embodiments, the acoustic obstacles 56 can include a metal pattern, or any other suitable obstacle. For example, the acoustic obstacles 56 can include the same material as that of the resonators (a first resonator 52*a*, a second resonator 52*b*, a third resonator 52*c*, and a fourth resonator 52*d*). The acoustic obstacle 56 can further reduce and/or eliminate acoustic coupling between the first resonator 52*a* and the second resonator 52*b*, and between the third resonator 52*c* and the fourth resonator 52*d*. Like the acoustic obstacle 36, the acoustic obstacles 56 can absorb and/or scatter acoustic energy.

Figures 15A, 15B:
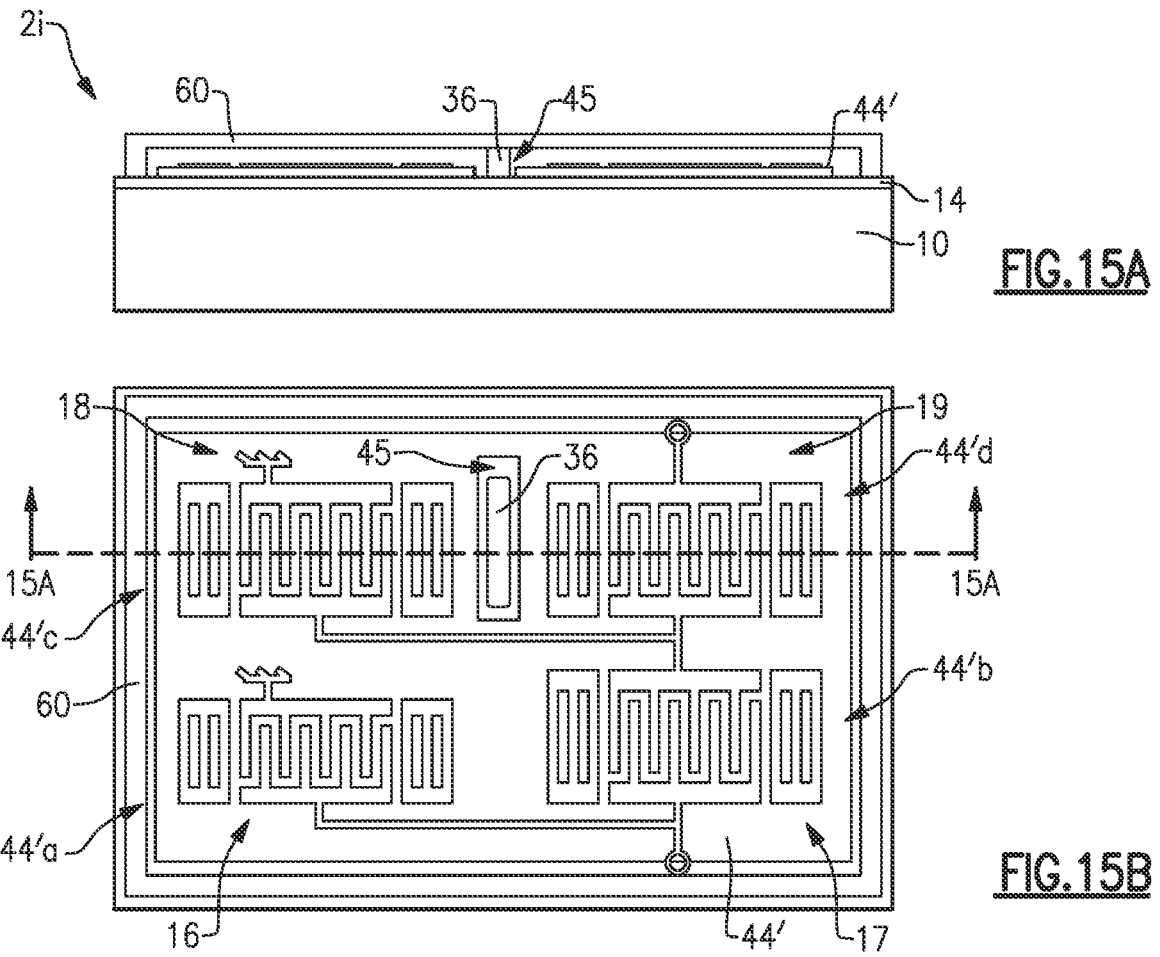
FIG. 15A is a schematic cross-sectional side view of an acoustic wave device according to another embodiment.
FIG. 15B is a schematic top plan view of the acoustic wave device illustrated in FIG. 15A.

FIG. 15A is a schematic cross-sectional side view of an acoustic wave device 2*i* according to an embodiment. FIG. 15B is a schematic top plan view of the acoustic wave device 2*i* illustrated in FIG. 15A. The acoustic wave device 2*i* is generally similar to the acoustic wave device 2*d* illustrated in FIGS. 10C and 10D, except that the acoustic wave device 2*i* includes an acoustic obstacle 36 and a lid structure 60. In some embodiments, the acoustic obstacle 36 and the lid structure 60 can be coupled. In such embodiments, the acoustic obstacle 36 provide mechanical support for the lid structure, in addition to reducing and/or eliminate acoustic coupling between the third resonator 18 and the fourth resonator 19.

Figures 16A, 16B:
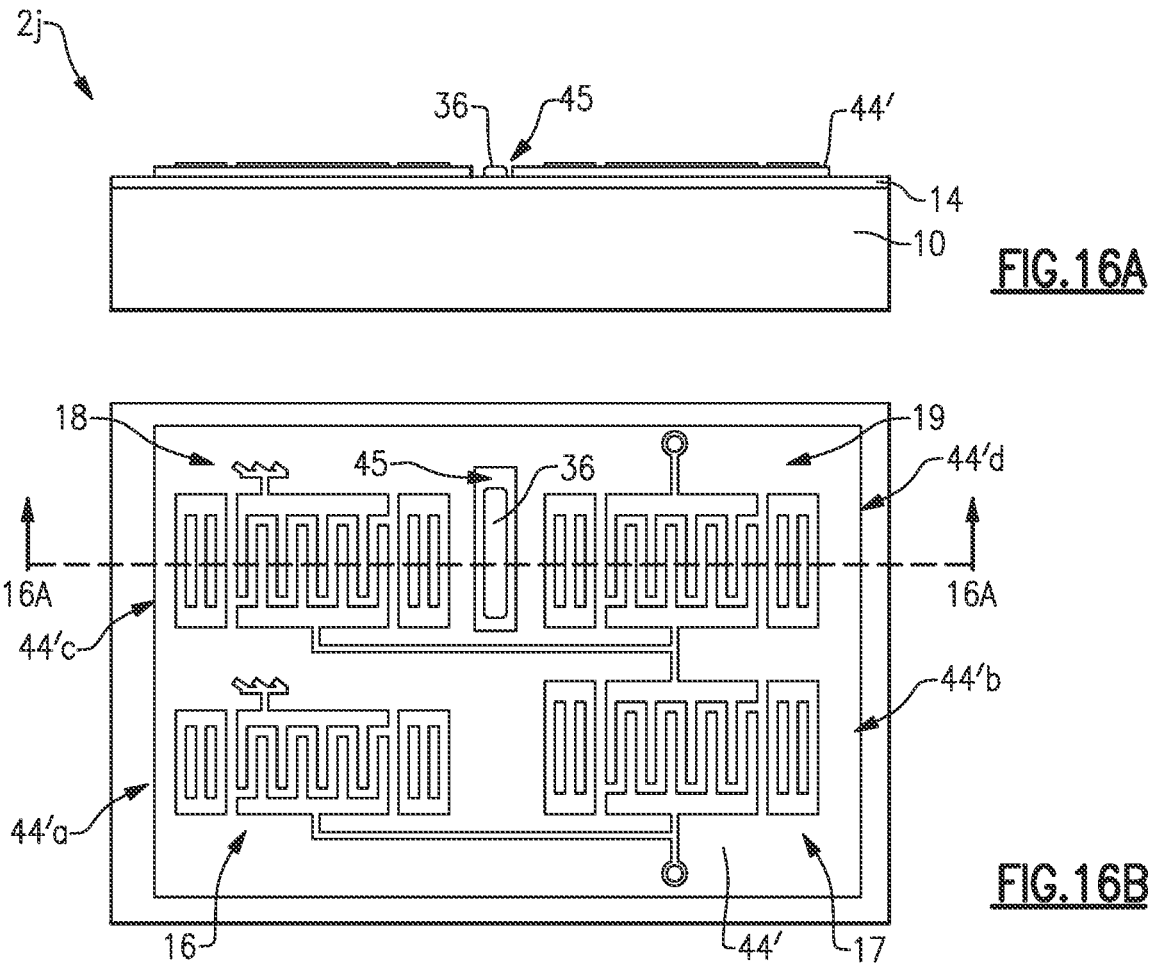
FIG. 16A is a schematic cross-sectional side view of an acoustic wave device according to another embodiment.
FIG. 16B is a schematic top plan view of the acoustic wave device illustrated in FIG. 16A.

FIG. 16A is a schematic cross-sectional side view of an acoustic wave device 2*j* according to an embodiment. FIG. 16B is a schematic top plan view of the acoustic wave device 2*j* illustrated in FIG. 16A. The acoustic wave device 2*j* is similar to the acoustic wave device 2*i* illustrated in FIGS. 15A and 15B except that the lid structure 60 omitted from the acoustic wave device 2*j*.

Figures 17A, 17B:
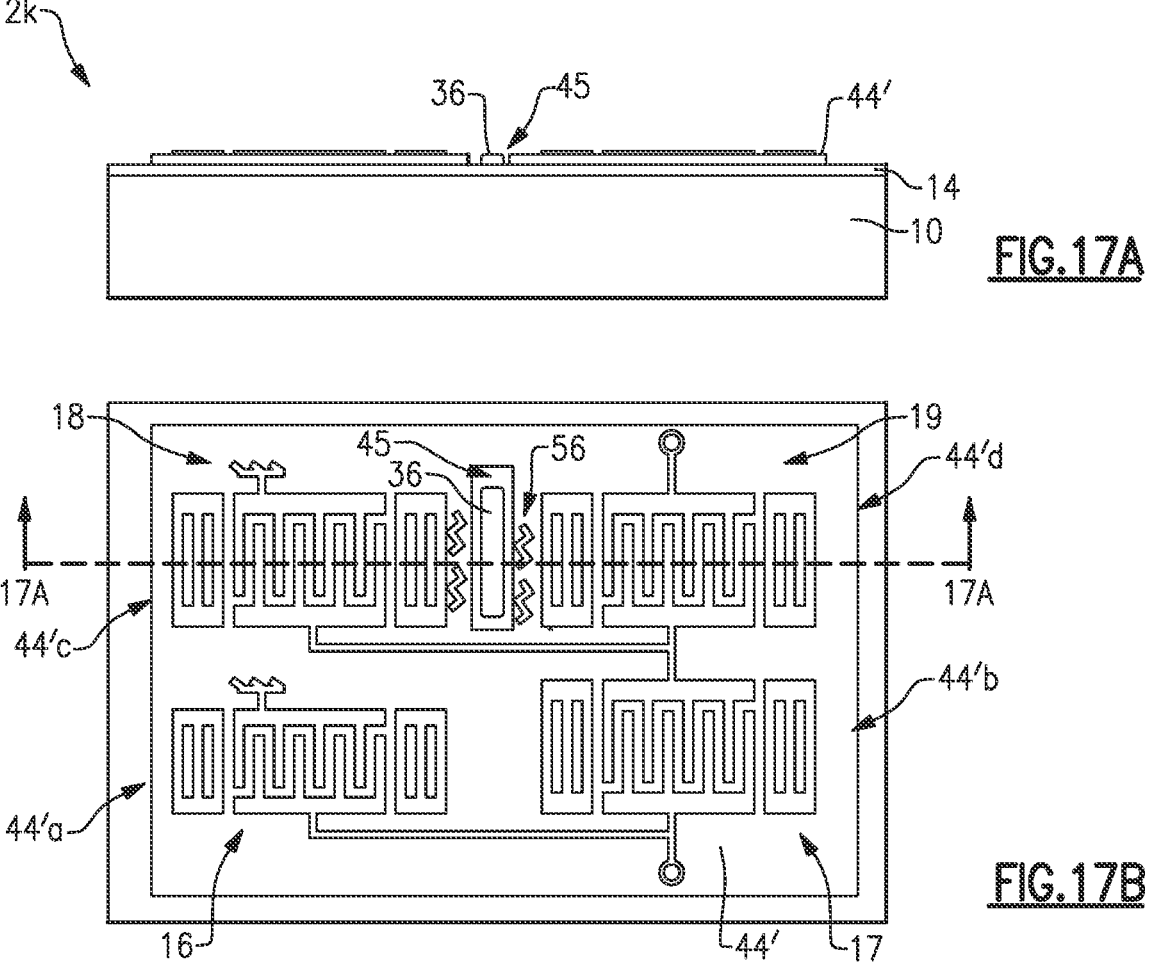
FIG. 17A is a schematic cross-sectional side view of an acoustic wave device according to another embodiment.
FIG. 17B is a schematic top plan view of the acoustic wave device illustrated in FIG. 17A.

FIG. 17A is a schematic cross-sectional side view of an acoustic wave device 2*k* according to an embodiment. FIG. 17B is a schematic top plan view of the acoustic wave device 2*k* illustrated in FIG. 17A. The acoustic wave device 2*k* is similar to the acoustic wave device 2*j* illustrated in FIGS. 16A and 16B except that the acoustic wave device 2*k* includes acoustic obstacles 56, in addition to the acoustic obstacle 36.

FIGS. 18A-21B show variations of an acoustic wave device similar to the acoustic wave device 3 illustrated in FIGS. 3A and 3B. Each of these variations shown in FIGS. 18A-21B can be applied to or combined with any of the acoustic wave devices disclosed herein.

Figure 18A:
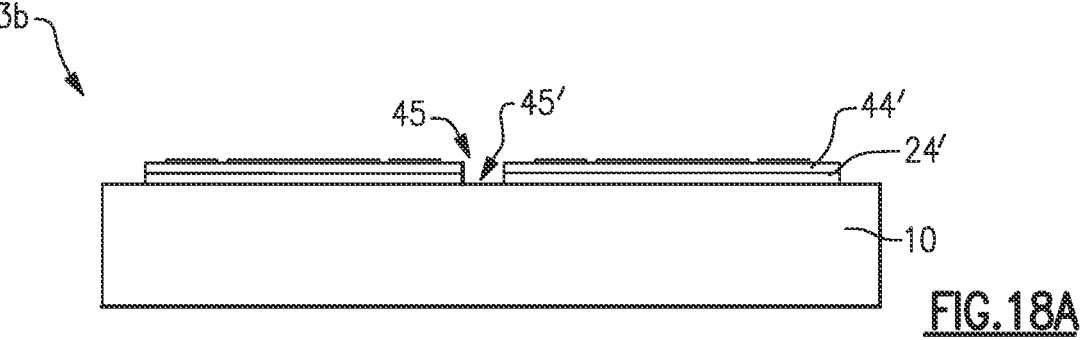
FIG. 18A is a schematic cross-sectional side view of an acoustic wave device according to another embodiment.
Figure 18B:
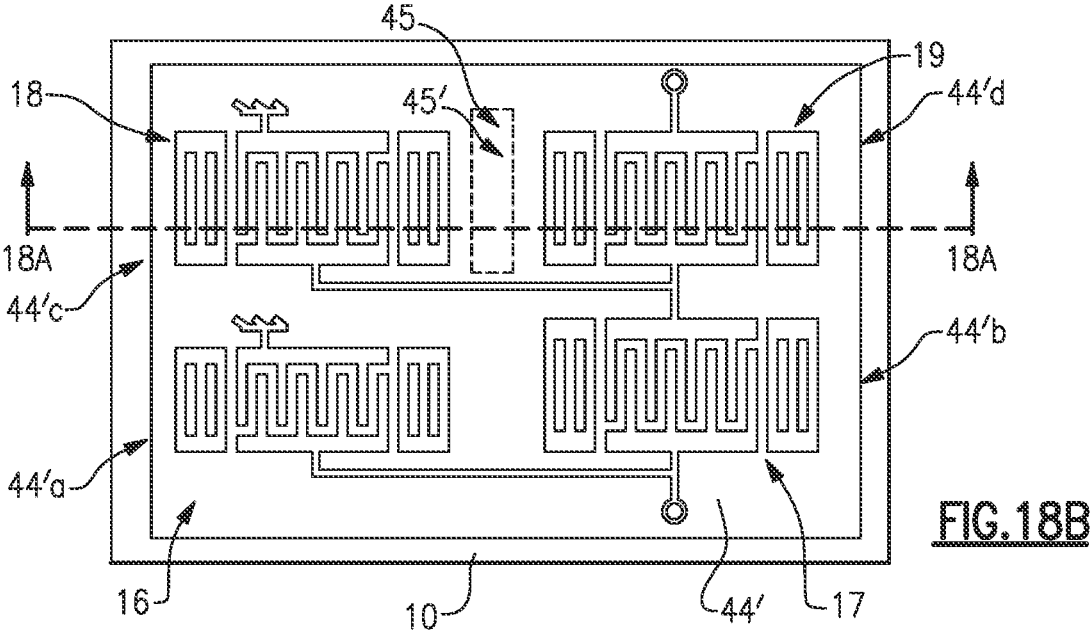
FIG. 18B is a schematic top plan view of the acoustic wave device illustrated in FIG. 18A.

FIG. 18A is a schematic cross-sectional side view of an acoustic wave device 3*b* according to an embodiment. FIG. 18B is a schematic top plan view of the acoustic wave device 3*b* illustrated in FIG. 18A. The acoustic wave device 3*b* is generally similar to the acoustic wave device 2*i* illustrated in FIGS. 10C and 10D. Unlike the acoustic wave device 2*i*, the intermediate layer 24' of the acoustic wave device 3*b* also includes a slot 45' that aligns with a slot 45 in a piezoelectric layer 44'. The slot 45' can further reduce acoustic coupling between the third resonator 18 and the fourth resonator 19.

Figure 19A:
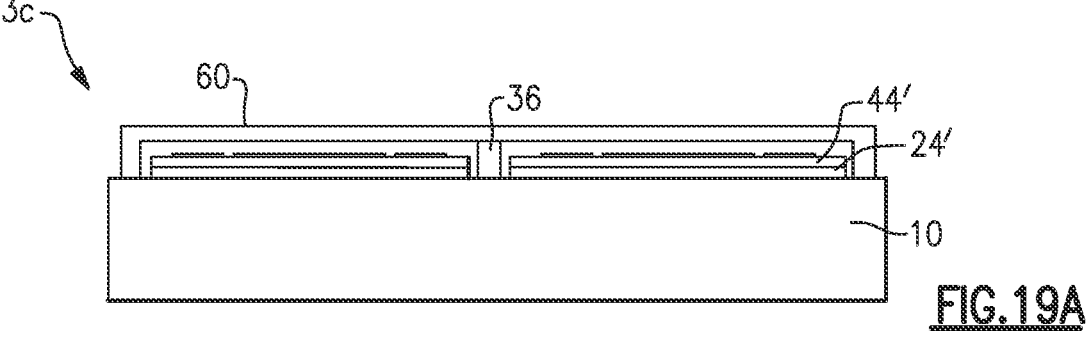
FIG. 19A is a schematic cross-sectional side view of an acoustic wave device according to another embodiment.
Figure 19B:
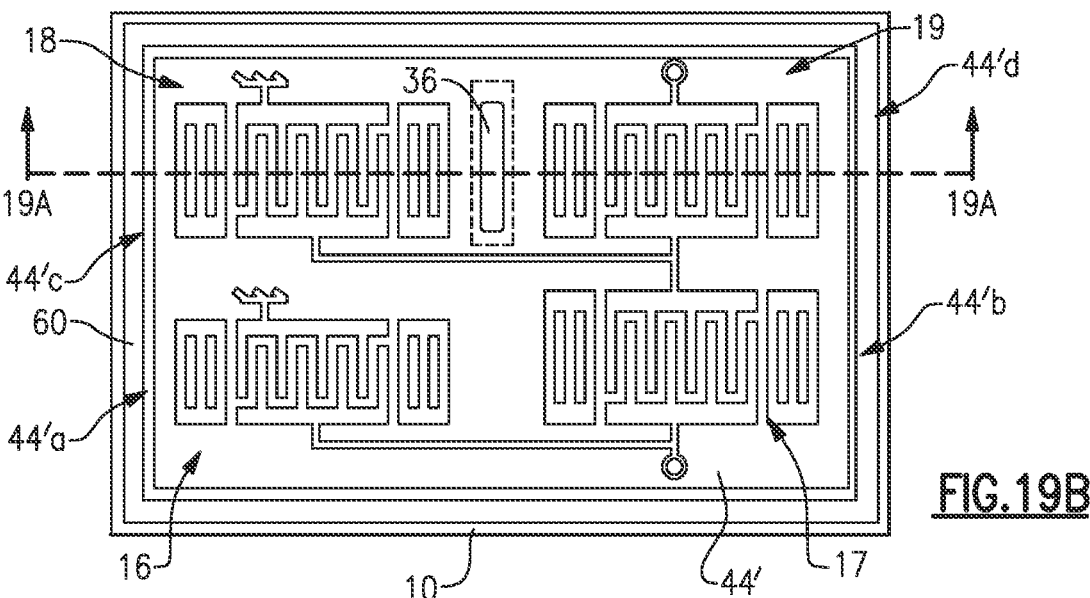
FIG. 19B is a schematic top plan view of the acoustic wave device illustrated in FIG. 19A.

FIG. 19A is a schematic cross-sectional side view of an acoustic wave device 3*c* according to an embodiment. FIG. 19B is a schematic top plan view of the acoustic wave device 3*c* illustrated in FIG. 19A. FIGS. 19A and 19B show that a combination of the features of the acoustic wave device 2*i* illustrated in FIGS. 15A and 15B, and the acoustic wave device 3*b* illustrated in FIGS. 18A and 18B is possible.

Figures 20A, 20B:
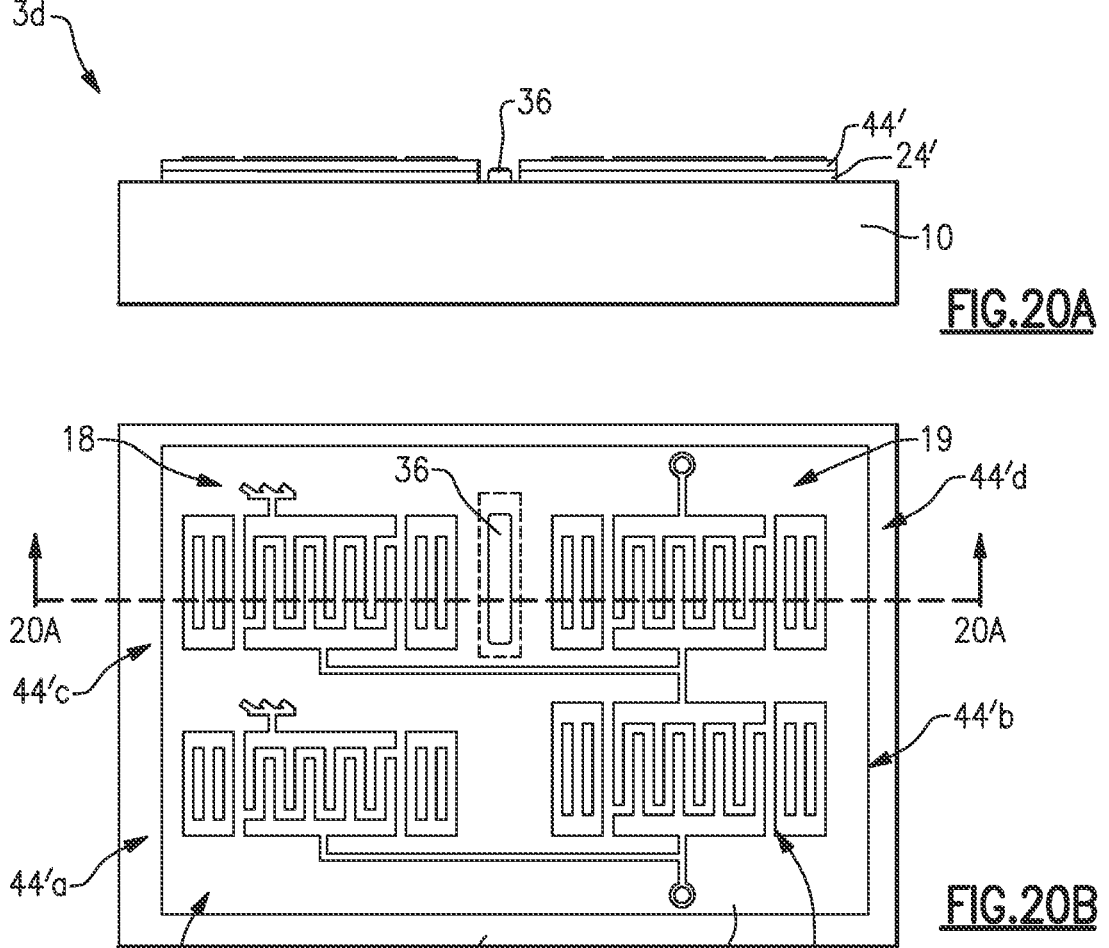
FIG. 20A is a schematic cross-sectional side view of an acoustic wave device according to another embodiment.
FIG. 20B is a schematic top plan view of the acoustic wave device illustrated in FIG. 20A.

FIG. 20A is a schematic cross-sectional side view of an acoustic wave device 3*d* according to an embodiment. FIG. 20B is a schematic top plan view of the acoustic wave device 3d illustrated in FIG. 20A. FIGS. 19A and 19B show that a combination of the features of the acoustic wave device 2j illustrated in FIGS. 16A and 16B, and the acoustic wave device 3b illustrated in FIGS. 18A and 18B is possible.

Figure 21A:
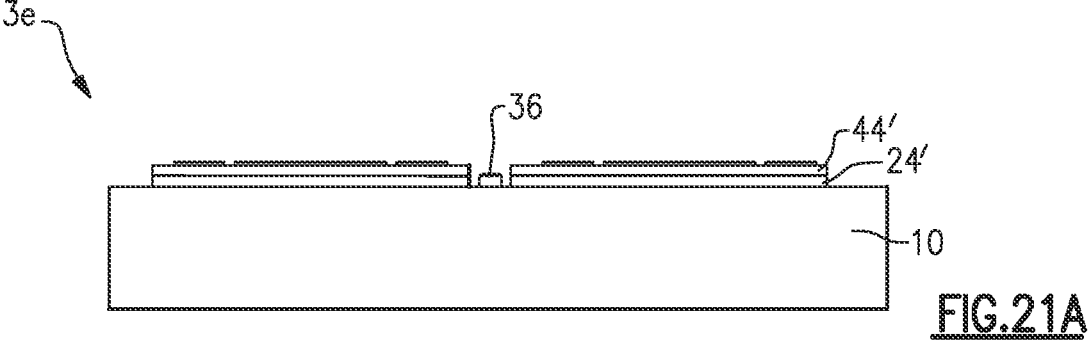
FIG. 21A is a schematic cross-sectional side view of an acoustic wave device according to another embodiment.
Figure 21B:
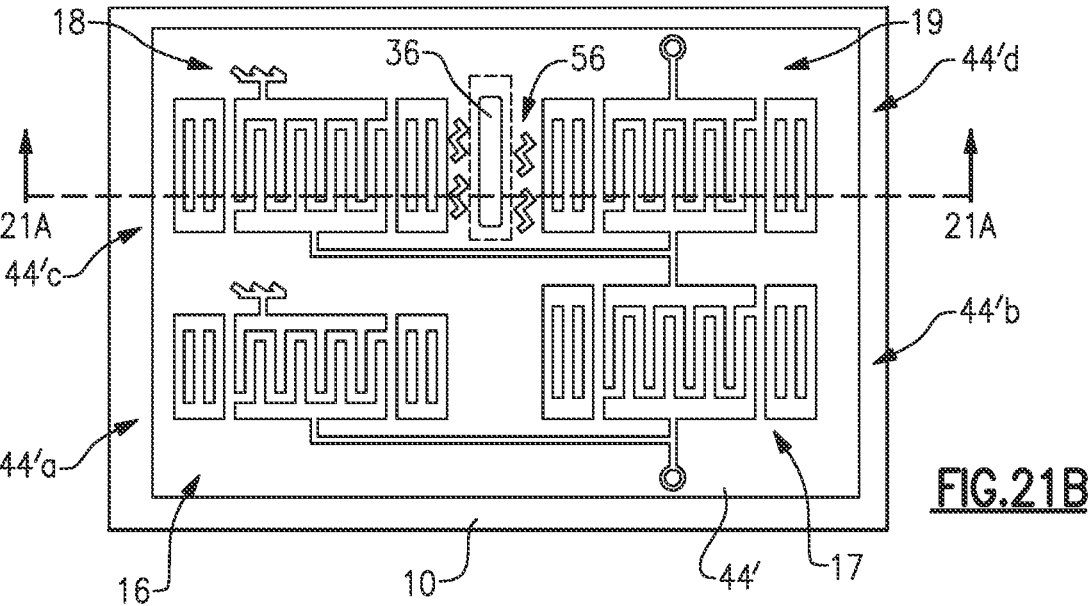
FIG. 21B is a schematic top plan view of the acoustic wave device illustrated in FIG. 21A.

FIG. 21A is a schematic cross-sectional side view of an acoustic wave device 3e according to an embodiment. FIG. 21B is a schematic top plan view of the acoustic wave device 3e illustrated in FIG. 21A. FIGS. 19A and 19B show that a combination of the features of the acoustic wave device 2k illustrated in FIGS. 17A and 17B, and the acoustic wave device 3b illustrated in FIGS. 18A and 18B is possible.

FIG. 22A shows a graph showing simulated transmission characteristics of the acoustic wave devices 1a, 2a, shown in FIG. 7. FIG. 22B shows a graph showing measured transmission characteristics of acoustic wave devices having structures of the acoustic wave devices 1a, 2a. It can be observed that the simulated transmission characteristics and the calculated transmission characteristics have a similar tendency of decreasing the main response.

Any suitable principle and advantages disclosed herein can be implemented in association with various types of acoustic devices. For example, various acoustic obstruction structures disclosed herein can prevent or mitigate cross talk between a feedback circuit and an IDT in a ladder filter, cross talk between a feedback circuit and an IDT in a DMS filter, cross talk between an IDT in a ladder filter and another IDT in the ladder filter, cross talk between an IDT in a ladder filter and an IDT in a DMS filter, or cross talk between an IDT in a DMS filter and another IDT in the DMS filter.

In various embodiments disclosed herein, disconnected (or separated) portions, such as disconnected piezoelectric layer portions or disconnected intermediate layer portions, can mean that the portions are not connected at least partially by the material of the portion. The disconnected portions may still be indirectly be connected by different portions of the material of the disconnected portions, or by a different material.

A method of forming an acoustic wave device can include providing a structure that has a support substrate, a piezoelectric layer a first interdigital transducer, and a second interdigital transducer electrode. The support substrate can include a first substrate portion, a second substrate portion, and a third substrate portion between the first portion and the second portion. The piezoelectric layer can include a first portion over the first substrate portion and a second portion over the second substrate portion. The first interdigital transducer electrode can be disposed on the first portion of the piezoelectric layer, and the second interdigital transducer electrode can be disposed on the second portion of the piezoelectric layer. The method can also include forming an acoustic obstruction structure. The acoustic obstruction structure can be, for example, a physical separation of the first and second portions of a piezoelectric layer. In some embodiments, the physical separation can be an opening in the piezoelectric layer. The forming the acoustic obstruction structure can include etching at least a portion of the piezoelectric layer such that a region over the third substrate portion is free from the piezoelectric layer.

Various acoustic wave devices disclosed herein can include filters as resonators, and a multi-channel feedback circuit. The acoustic wave devices disclosed herein can be arranged as multiplexer (e.g., a duplexer, quadplexers, hexaplexers, etc.) having a transmit port Tx, a receive port Rx, and an antenna port ANT. Moreover, any suitable principle and advantages disclosed herein can be implemented in association with a single filter and/or a plurality of filters. Additional descriptions regarding feedback circuits and use of such circuits may be found throughout U.S. Pat. No. 10,483,942, the entire content of which is incorporated by reference herein in its entirety and for all purposes.

Figure 23A:
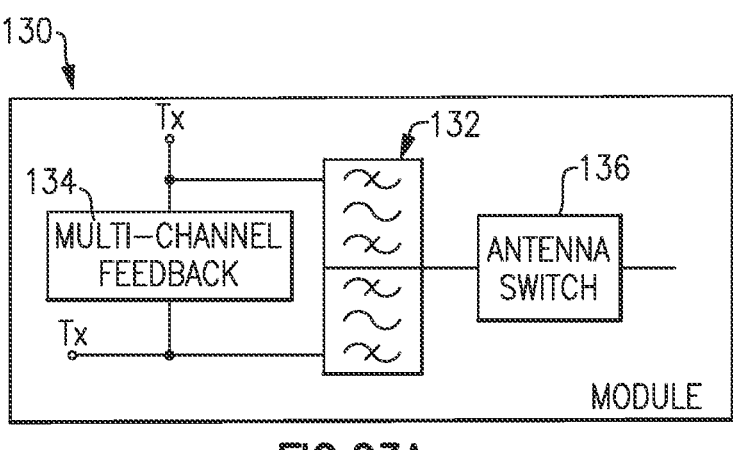
FIG. 23A is a schematic block diagram of a module that includes a duplexer, a multi-channel feedback circuit, and an antenna switch in accordance with one or more embodiments.

FIG. 23A is a schematic block diagram of a module 130 that includes a duplexer 132, a multi-channel feedback circuit 134, and an antenna switch 136 in accordance with one or more embodiments. The module 130 can include a package that encloses the illustrated elements. The duplexer 132, the multi-channel feedback circuit 134, and the antenna switch 136 can be disposed on a common packaging substrate. The packaging substrate can be a laminate substrate, for example. The duplexer 132 can include any suitable number of acoustic wave resonators. For instance, the duplexer 132 can include one or more SAW resonators and/or one or more BAW resonators. As illustrated, the multi-channel feedback circuit 134 is coupled between a receive port Rx and a transmit port Tx of the duplexer 132. The multi-channel feedback circuit 134 can be implemented in accordance with any suitable principles and advantages discussed herein. For example, the multi-channel feedback circuit 134 can include any suitable acoustic obstacle discussed herein to reduce and/or eliminate acoustic coupling between canceling circuits. The antenna switch 136 can be a multi-throw radio frequency switch. The antenna switch 136 can selectively electrically couple a common node of the duplexer 232 to an antenna port of the module 130.

Figure 23B:
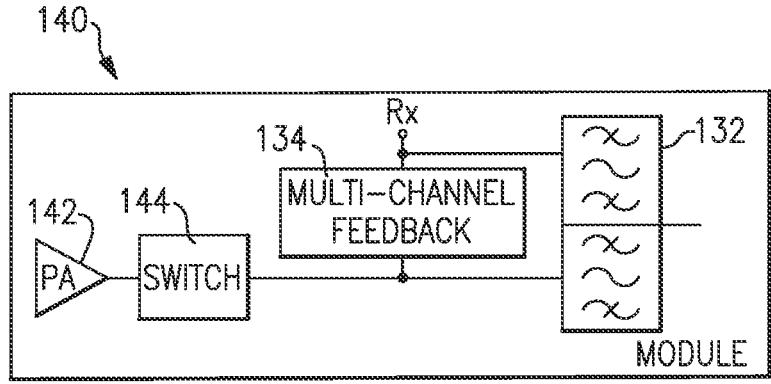
FIG. 23B is a schematic block diagram of a module that includes a power amplifier, a switch, a duplexer, and a multi-channel feedback circuit in accordance with one or more embodiments.

FIG. 23B is a schematic block diagram of a module 140 that includes a power amplifier 142, a switch 144, a duplexer 132, and a multi-channel feedback circuit 134 in accordance with one or more embodiments. The power amplifier 142 can amplify a radio frequency signal. The switch 144 can selectively electrically couple an output of the power amplifier 142 to a transmit port of the duplexer 132. The multi-channel feedback circuit 134 can be implemented in accordance with any suitable principles and advantages discussed herein.

Figure 23C:
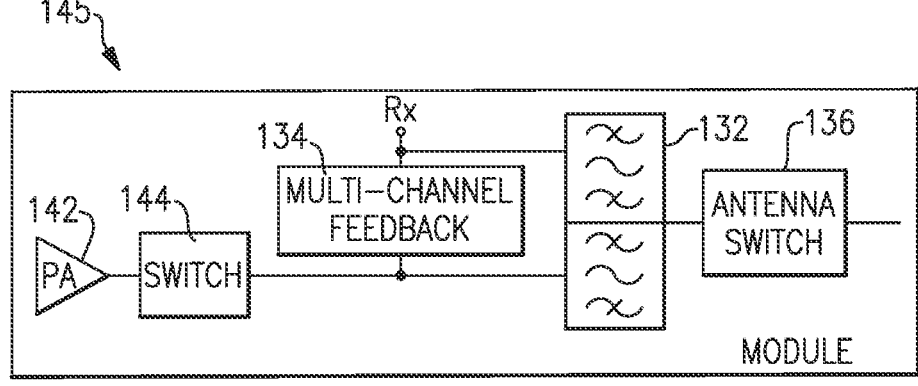
FIG. 23C is a schematic block diagram of a module that includes power amplifier, a switch, a duplexer, a multi-channel feedback circuit, and an antenna switch in accordance with one or more embodiments.

FIG. 23C is a schematic block diagram of a module 145 that includes power amplifier 142, a switch 144, a duplexer 132, a multi-channel feedback circuit 134, and an antenna switch 136 in accordance with one or more embodiments. The module 145 is similar to the module 140 of FIG. 23B, except the module 145 additionally includes the antenna switch 136.

Figure 24:
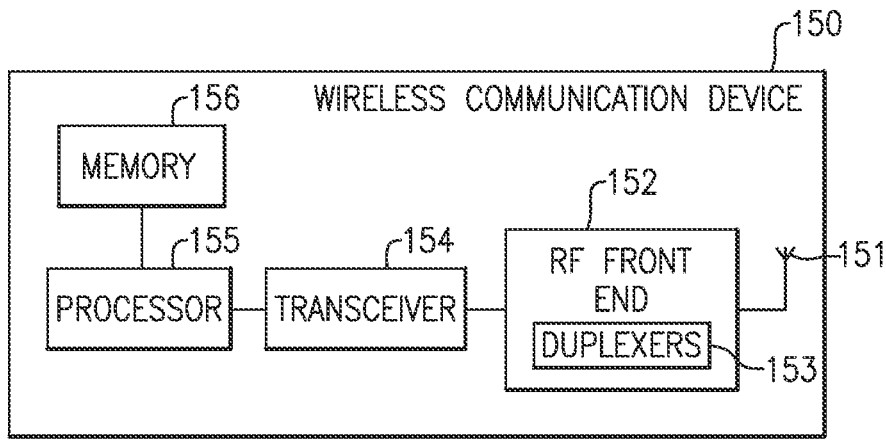
FIG. 24 is a schematic block diagram of a wireless communication device that includes duplexers in accordance with one or more embodiments.

FIG. 24 is a schematic block diagram of a wireless communication device 150 that includes duplexers 153 in accordance with one or more embodiments. The wireless communication device 150 can be any suitable wireless communication device. For instance, a wireless communication device 150 can be a mobile phone, such as a smart phone. As illustrated, the wireless communication device 150 includes an antenna 151, an RF front end 152, an RF transceiver 154, a processor 155, and a memory 156. The antenna 151 can transmit RF signals provided by the RF front end 152. The antenna 151 can provide received RF signals to the RF front end 152 for processing.

The RF front end 152 can include one or more power amplifiers, one or more low noise amplifiers, RF switches, receive filters, transmit filters, duplex filters, filters of a multiplexer, filters of a diplexers or other frequency multiplexing circuit, or any suitable combination thereof. The RF front end 152 can transmit and receive RF signals associated with any suitable communication standards. Any of the acoustic wave devices and/or multi-channel feedback circuits discussed herein can be implemented in the RF front end 152.

The RF transceiver 154 can provide RF signals to the RF front end 152 for amplification and/or other processing. The RF transceiver 154 can also process an RF signal provided by a low noise amplifier of the RF front end 152. The RF transceiver 154 is in communication with the processor 155. The processor 155 can be a baseband processor. The processor 155 can provide any suitable base band processing functions for the wireless communication device 150. The memory 156 can be accessed by the processor 155. The memory 156 can store any suitable data for the wireless communication device 150.

Figure 25B:
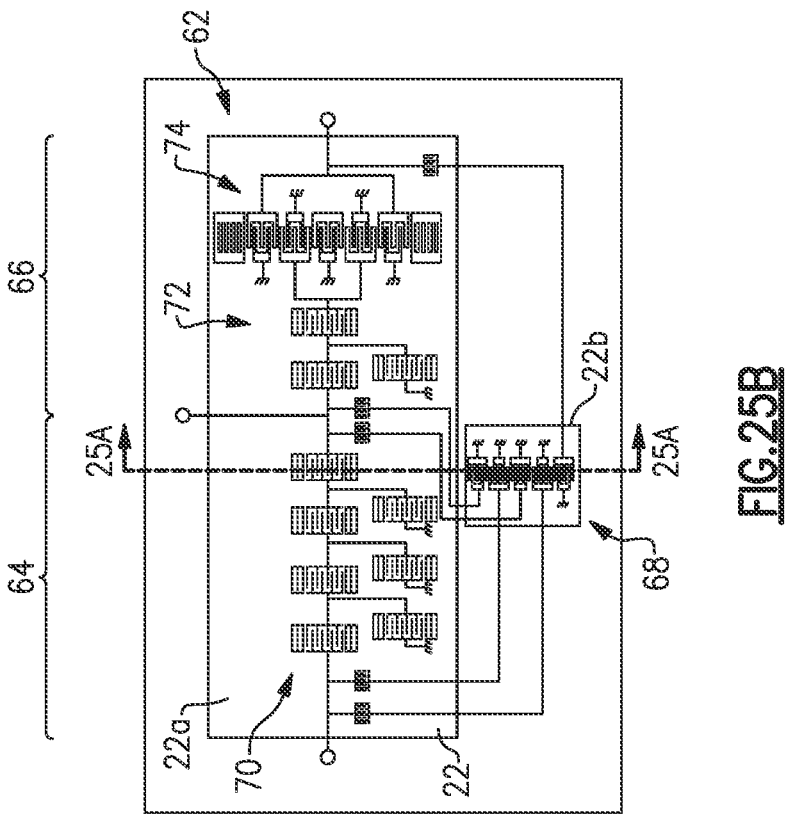
FIG. 25B is a schematic top plan view of the acoustic wave device illustrated in FIG. 25A.
Figure 25A:
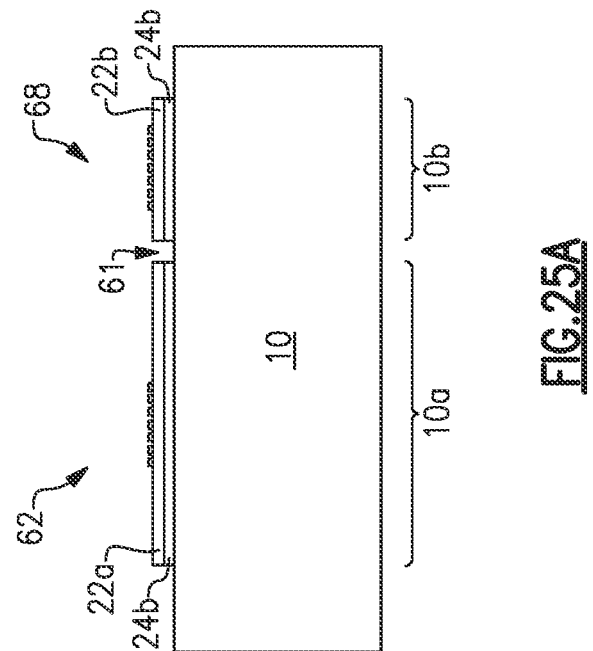
FIG. 25A is a schematic cross-sectional side view of an acoustic wave device according to an embodiment.

FIG. 25A is a schematic cross-sectional side view of an acoustic wave device 4, according to an embodiment. FIG. 25B is a schematic top plan view of the acoustic wave device 4 illustrated in FIG. 25A. Unless otherwise noted, components of the acoustic wave device 4 may be the same or generally similar to like components of any acoustic wave device disclosed herein. The acoustic wave device 4 includes a support substrate 10, a piezoelectric layer 22 over the support substrate 10, and an intermediate layer 24 between the support substrate 10 and the piezoelectric layer 22. The intermediate layer 24 can have a first portion 24a over a first portion 10a of the support substrate 10 and a second portion 24b over a second portion 10b of the support substrate 10. The piezoelectric layer 22 can have a first portion 22a over the first portion 24a of the intermediate layer 24 and a second portion 22b over the second portion 24b of the intermediate layer.

The acoustic wave device 4 can include a filter circuit 62 formed over a first portion 22a of the piezoelectric layer 22. The filter circuit 62 can include a first filter portion 64 and a second filter portion 66. The acoustic wave device 4 can include a cancelation circuit 68. The first filter portion 64 of the filter circuit 62 can include one or more series resonators and one or more shunt resonators. The first filter portion 64 of the filter circuit 62 can include ladder filters 70. The second filter portion 66 of the filter circuit 62 can include one or more series resonators and one or more shunt resonators. The second filter portion 66 of the filter circuit 62 can include ladder filters 72 and one or more multi-mode longitudinally coupled SAW (e.g., DMS) devices 74. The cancelation circuit 68 can include one or more multi-mode longitudinally coupled SAW (e.g., DMS) devices, or one or more coupled resonator filters (CRF).

The first portion 24a and a second portion 24b of the intermediate layer 24 can be physically separated by a gap 61 therebetween, and the first portion 22a and a second portion 22b of the piezoelectric layer 22 can be physically separated by a gap 61 therebetween. In some embodiments, the gap 61 can be free from the intermediate layer 24 and the piezoelectric layer 22. In such embodiments, at least a portion of the support substrate 10 can be exposed through the gap 61.

The gap 61 is an example of an obstruction structure. The gap 61 can be formed by way of a removing process. For example, the gap 61 can be formed by way of etching. In some embodiments, the selection can be made based at least in part on the arrangements of the resonators. For example, a region that is located in an acoustic wave propagation direction and/or in a longitudinal direction of a resonator can be selected to be removed. The gap 61 can reduce and/or eliminate acoustic coupling between the filter circuit 62 and the cancelation circuit 68.

The cancelation circuit can realize a relatively high attenuation and relatively high isolation characteristics. A signal of the canceling circuit 68 can be carefully tuned to cancel out a signal of the filter circuit 62 by a phase inverted signal. Unexpected acoustic coupling between the canceling circuit 68 and the filter circuit 62 can degrade the attenuation and isolation performance of the cancelation circuit 68. The acoustic obstruction structures disclosed herein, such as the gap 61, can reduce acoustic coupling between the cancelation circuit 68 and the filter circuit 62.

Any of the embodiments described above can be implemented in association with mobile devices such as cellular handsets. The principles and advantages of the embodiments can be used for any systems or apparatus, such as any uplink cellular device, that could benefit from any of the embodiments described herein. The teachings herein are applicable to a variety of systems. Although this disclosure includes some example embodiments, the teachings described herein can be applied to a variety of structures. For instance, while certain embodiments are discussed with reference to duplexers, any suitable principles and advantages can be implemented in association with diplexers and/or other frequency multiplexing circuits. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as semiconductor die and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
a support substrate including a first substrate portion, a second substrate portion, and a third substrate portion between the first substrate portion and the second substrate portion;
a piezoelectric layer including a first portion over the first substrate portion and a second portion over the second substrate portion, the piezoelectric layer arranged such that a region over the third substrate portion is free from the piezoelectric layer;
an acoustic obstacle in the region over the third substrate portion, the acoustic obstacle arranged to absorb acoustic energy;
a first interdigital transducer electrode on the first portion of the piezoelectric layer; and
a second interdigital transducer electrode on the second portion of the piezoelectric layer.

2. The acoustic wave device of claim 1 wherein an etched portion of the piezoelectric layer defines the region over the third substrate portion that is free from the piezoelectric layer.

3. The acoustic wave device of claim 1 wherein the second interdigital transducer electrode is positioned in a longitudinal direction of the first interdigital transducer electrode.

4. The acoustic wave device of claim 1 wherein the second interdigital transducer electrode is positioned in an acoustic propagation direction of the first interdigital transducer electrode.

5. The acoustic wave device of claim 1 further comprising an intermediate layer between the support substrate and the piezoelectric layer.

6. The acoustic wave device of claim 5 wherein the intermediate layer includes a first portion and a second portion under the first portion of the piezoelectric layer and the second portion of the piezoelectric layer respectively.

7. The acoustic wave device of claim 6 wherein the region over the third substrate portion that is free from the piezoelectric layer is free from the intermediate layer.

8. The acoustic wave device of claim 1 further comprising a lid structure coupled to the acoustic obstacle.

9. The acoustic wave device of claim 1 wherein the acoustic obstacle includes a polymer.

10. The acoustic wave device of claim 1 further comprising a patterned metal formed on the piezoelectric layer between the first interdigital transducer electrode and the second interdigital transducer electrode.

11. The acoustic wave device of claim 1 wherein edges of the first portion of the piezoelectric layer have non-straight edges.

12. The acoustic wave device of claim 1 wherein the first interdigital transducer electrode is tilted.

13. An acoustic wave device comprising:
a support substrate including a first substrate portion, a second substrate portion, and a third substrate portion between the first substrate portion and the second substrate portion;
a piezoelectric layer including a first portion over the first substrate portion and a second portion over the second substrate portion, the piezoelectric layer having a reduced thickness portion between the first portion and the second portion of the piezoelectric layer that has a reduced thickness relative to a thickness of the first portion or the second portion of the piezoelectric layer;
an acoustic obstacle in the region over the third substrate portion, the acoustic obstacle arranged to absorb acoustic energy;
a first interdigital transducer electrode on the first portion of the piezoelectric layer; and
a second interdigital transducer electrode on the second portion of the piezoelectric layer.

14. The acoustic wave device of claim 13 wherein an etched portion of the piezoelectric layer defines a region over the third substrate portion that is free from the piezoelectric layer.

15. The acoustic wave device of claim 13 wherein the second interdigital transducer electrode is positioned in a longitudinal direction of the first interdigital transducer electrode.

16. The acoustic wave device of claim 13 wherein the second interdigital transducer electrode is positioned in an acoustic propagation direction of the first interdigital transducer electrode.

17. The acoustic wave device of claim 13 further comprising an intermediate layer between the support substrate and the piezoelectric layer.

18. The acoustic wave device of claim 17 wherein the intermediate layer includes a first substrate portion and a second substrate portion under the first portion of the piezoelectric layer and the second portion of the piezoelectric layer respectively.

19. The acoustic wave device of claim 17 wherein the region over the third substrate portion that is free from the piezoelectric layer is free from the intermediate layer.

20. The acoustic wave device of claim 13 further comprising a lid structure coupled to the acoustic obstacle.

* * * * *